United States Patent
Eckhardt et al.

(10) Patent No.: US 8,934,263 B2
(45) Date of Patent: Jan. 13, 2015

(54) PROTECTIVE COVER FOR PRESSURE SENSOR ASSEMBLIES

(75) Inventors: Todd Eckhardt, Westerville, OH (US); Jim Machir, Columbus, OH (US); Palani Thanigachalam, Bangalore (IN); Sunil Job, Thiruvananthapuram (IN)

(73) Assignee: Honeywell International Inc., Morristown, NJ (US)

( * ) Notice: Subject to any disclaimer, the term of this patent is extended or adjusted under 35 U.S.C. 154(b) by 357 days.

(21) Appl. No.: 13/195,806

(22) Filed: Aug. 1, 2011

(65) Prior Publication Data
US 2013/0033841 A1    Feb. 7, 2013

(51) Int. Cl.
| | |
|---|---|
| G01L 7/00 | (2006.01) |
| G01L 9/00 | (2006.01) |
| H01R 29/00 | (2006.01) |
| H02B 1/056 | (2006.01) |
| H01R 13/40 | (2006.01) |
| H05K 1/11 | (2006.01) |
| H05K 1/14 | (2006.01) |
| G01L 9/16 | (2006.01) |

(Continued)

(52) U.S. Cl.
CPC ............. *G01L 9/00* (2013.01); *H01R 12/585* (2013.01); *H01R 12/523* (2013.01); *H05K 1/144* (2013.01); *H05K 2201/042* (2013.01); *H05K 2201/10151* (2013.01); *H05K 2201/1059* (2013.01); *H05K 2201/10303* (2013.01); *H01R 13/64* (2013.01)
USPC ............. 361/796; 73/700; 73/753; 73/754; 73/756; 439/44; 439/591; 361/784

(58) Field of Classification Search
CPC ............. G01L 7/00; G01L 7/18; G01L 9/00; G01L 9/0001; H05K 1/14; H05K 1/144; H01R 9/09
USPC ........... 361/796, 784, 726, 700; 73/753, 700, 73/754, 756; 439/44, 591
See application file for complete search history.

(56) References Cited

U.S. PATENT DOCUMENTS

| | | |
|---|---|---|
| 5,315,877 A | 5/1994 | Park et al. |
| 5,329,819 A | 7/1994 | Park et al. |

(Continued)

FOREIGN PATENT DOCUMENTS

EP    0915326 A1    5/1999

OTHER PUBLICATIONS

"Various Honeywell Products Sold", 14 pages, prior to Aug. 1, 2011.

(Continued)

*Primary Examiner* — Anthony Haughton
*Assistant Examiner* — Zhengfu Feng
(74) *Attorney, Agent, or Firm* — Seager Tufte & Wickhem LLC

(57) ABSTRACT

The present disclosure relates to sensors including pressure sensors, humidity sensors, flow sensors, etc. In some cases, a cover for use with a sensor assembly may include an electrically insulating body having perimeter features extending a majority of the way around perimeters of upper and lower printed circuit boards that the cover may vertically separate. In one example, the body of the cover may include support features that extend from a lower side of the cover and those support features may contact the lower printed circuit board in at least two locations. The support features of the cover may be separated by a gap and a sensor connected to the lower printed circuit board may be situated within the gap.

8 Claims, 27 Drawing Sheets

(51) Int. Cl.
*H01R 12/58* (2011.01)
*H01R 12/52* (2011.01)
*H01R 13/64* (2006.01)

(56) References Cited

U.S. PATENT DOCUMENTS

| | | | |
|---|---|---|---|
| 5,349,865 A | 9/1994 | Kavli et al. | |
| 5,554,809 A * | 9/1996 | Tobita et al. | 73/700 |
| 6,105,437 A | 8/2000 | Klug et al. | |
| 6,176,137 B1 * | 1/2001 | Sasaki et al. | 73/754 |
| 6,176,138 B1 * | 1/2001 | Barr et al. | 73/756 |
| 6,623,280 B2 * | 9/2003 | Oldenburg et al. | 439/75 |
| 6,877,380 B2 | 4/2005 | Lewis | |
| 6,923,069 B1 | 8/2005 | Stewart | |
| 6,945,118 B2 | 9/2005 | Maitland, Jr. et al. | |
| 7,024,937 B2 | 4/2006 | James | |
| 7,073,375 B2 | 7/2006 | Parker et al. | |
| 7,077,008 B2 | 7/2006 | Pham et al. | |
| 7,082,835 B2 | 8/2006 | Cook et al. | |
| 7,086,290 B2 | 8/2006 | Parker et al. | |
| 7,210,346 B1 | 5/2007 | Hoover et al. | |
| 7,216,048 B2 | 5/2007 | Wang et al. | |
| 7,216,547 B1 | 5/2007 | Stewart et al. | |
| 7,260,994 B2 | 8/2007 | Oboodi et al. | |
| 7,266,999 B2 | 9/2007 | Ricks | |
| 7,373,830 B2 | 5/2008 | Thuruthumaly et al. | |
| 7,377,177 B1 | 5/2008 | Lamb et al. | |
| 7,434,474 B1 | 10/2008 | DuPuis | |
| 7,458,274 B2 | 12/2008 | Lamb et al. | |
| 7,493,822 B2 | 2/2009 | Stewart et al. | |
| 7,493,823 B2 | 2/2009 | Stewart et al. | |
| 7,503,221 B2 | 3/2009 | Wade | |
| 7,528,717 B2 | 5/2009 | Benjelloun et al. | |
| 7,811,123 B2 | 10/2010 | Hoath et al. | |
| 7,954,384 B2 | 6/2011 | Koehler et al. | |
| 8,024,978 B2 | 9/2011 | Khemet et al. | |
| 8,061,212 B2 | 11/2011 | Shubert | |
| 2003/0167851 A1 | 9/2003 | Parker | |
| 2007/0095144 A1 | 5/2007 | Oboodi et al. | |
| 2010/0064818 A1 | 3/2010 | Shubert | |
| 2010/0180688 A1 | 7/2010 | Khemet et al. | |
| 2010/0184324 A1 | 7/2010 | Hoath et al. | |

OTHER PUBLICATIONS

U.S. Appl. No. 13/195,756, filed Aug. 1, 2011.
U.S. Appl. No. 13/195,770, filed Aug. 1, 2011.
U.S. Appl. No. 13/195,815, filed Aug. 1, 2011.
U.S. Appl. No. 13/195,818, filed Aug. 1, 2011.
U.S. Appl. No. 13/195,821, filed Aug. 1, 2011.
U.S. Appl. No. 13/281,183, filed Oct. 25, 2011.
Honeywell, "Interactive Catalog Replaces Catalog pp. 22/24/26PC Series", p. 17-20, prior to May 9, 2011.
Honeywell, "Interactive Catalog Replaces Catalog Pages, 40PC Series", p. 31-33, prior to May 9, 2011.
Honeywell, "Microstructure Pressure Sensors 0 psi to 1 psi through 0 psi to 100 psi, ASDX DO Series", 6 pages, 2005.
Honeywell, "ZMD Heimdal Combi-Sensor ASIC", Drawing No. 50022601, p. 1-15, Nov. 23, 2006.
ZMDI, "ZMD31050/ZMD31150", Application Notes, Rev. 1.01, p. 1-4, Apr. 13, 2010.
ZMDI, "ZSC31050", Advanced Differential Sensor Signal Conditioner, Rev. 1.08, p. 1-50, Jul. 2010.

* cited by examiner

US 8,934,263 B2

PROTECTIVE COVER FOR PRESSURE SENSOR ASSEMBLIES

TECHNICAL FIELD

The present disclosure relates generally to sensors, and more particularly to sensor assembly structures.

BACKGROUND

Sensors are commonly used today to sense environmental parameters such as temperature, humidity, pressure, flow, thermal conductivity, gas concentration, light, magnetic fields, electric fields, as well as many other environmental parameters. Such sensors are used in a wide variety of applications including, for example, medical applications, flight control applications, industrial process applications, combustion control applications, weather monitoring applications, water metering applications, as well as many other applications.

SUMMARY

This disclosure is directed to several alternative designs, materials and methods of manufacturing electrically responsive sensor assemblies. Although sensor assemblies are known to exist, there is need for improvement to such sensor assemblies.

Accordingly, one illustrative aspect of the disclosure includes a cover for a pressure sensor subassembly having a lower printed circuit board that may carry a sensor and an upper printed circuit board vertically spaced above the lower printed circuit board. The cover may be electrically insulating and have an upper side facing the upper printed circuit board and a lower side facing the lower printed circuit board, where the cover may engage each printed circuit board at more than one location. The cover may include a perimeter portion that may extend around and along at least a majority of the perimeter of each printed circuit board. Further, the cover may include first and second support features that extend across a majority of and toward the lower printed circuit board, where the first and second support features may be separated by a gap in which a sensor may be situated and each support feature may contact the lower printed circuit board in at least two places. Additionally, the cover may include at least one vent and may support at least one compliant pin that may extend into corresponding holes in the upper printed circuit board and the lower printed circuit board. The compliant pins may be the sole mechanical connection between upper and lower printed circuit board.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments of the disclosure in connection with the accompanying drawings, in which.

Figure 1:
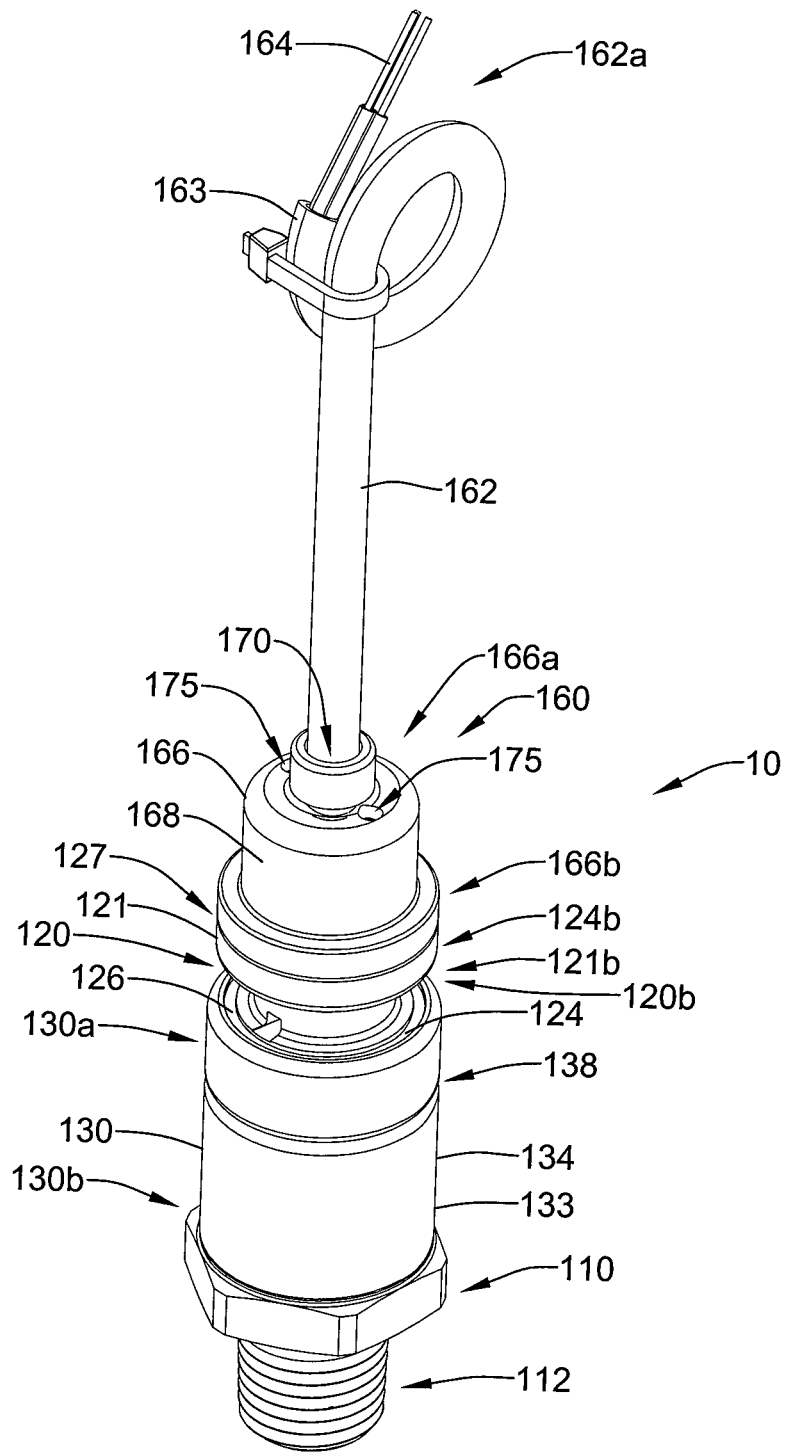
FIG. 1 is a perspective view of an illustrative sensor assembly and cable harness.

While the disclosure is amenable to various modifications and alternative forms, specifics thereof have been shown by way of example in the drawings and will be described in detail. It should be understood, however, that the intention is not to limit aspects of the disclosure to the particular embodiments described herein. On the contrary, the intention is to cover all modifications, equivalents, and alternatives falling within the spirit and scope of the disclosure.

DESCRIPTION

The following description should be read with reference to the drawings wherein like reference numerals indicate like elements throughout the several views. The description and drawings show several embodiments which are meant to be illustrative of the disclosure.

Figure 2:
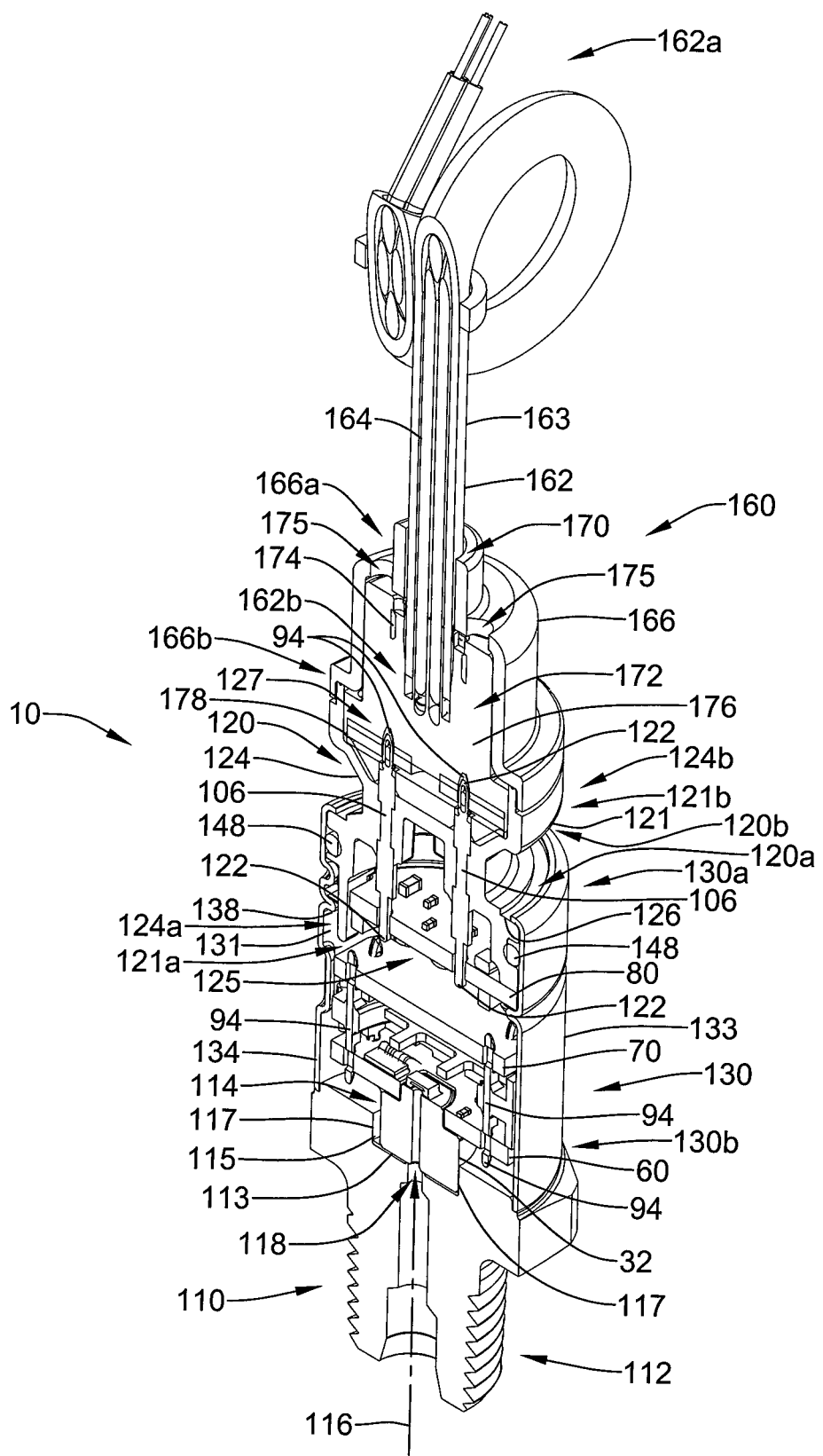
FIG. 2 is a schematic cross-sectional view of the illustrative sensor assembly and cable harness of FIG. 1.

Referring to the Figures, and in one illustrative embodiment, a sensor assembly 10 may include a sensor unit 20, pressure port 110, an electrical connector 120 and an outer housing 130, as depicted in FIGS. 1-5. In some instances, pressure port 110 may be mechanically connected to sensor unit 20, and at a first end 120a, electrical connector 120 may be mechanically and electrically connected to sensor unit 20, and at a second end 120b, electrical connector 120 may mechanically and electrically connect to a cable harness 160, as best seen in FIGS. 1 and 2. It is contemplated that sensor assembly 10 may be any suitable type of sensor assembly. For example, sensor assembly 10 may be a pressure sensor assembly, a humidity sensor assembly, a force sensor assembly, a pressure switch assembly, a light sensor assembly, a gas concentration sensor assembly, a magnetic or electrical field sensor assembly, a conductivity sensor assembly, or another other suitable sensor assembly.

Figure 4:
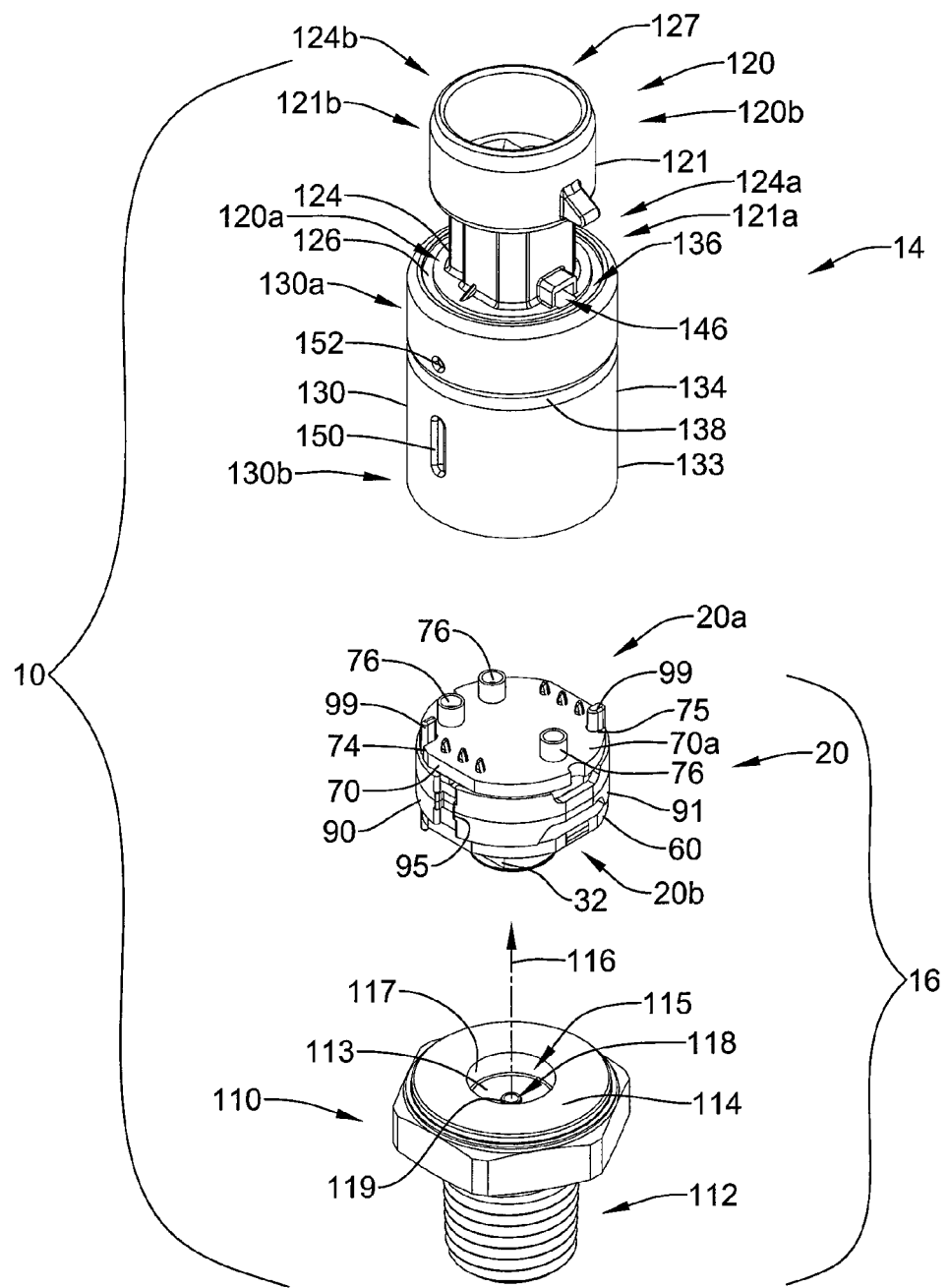
FIG. 4 is an exploded perspective view of the illustrative sensor assembly of FIG. 3.
Figure 13:
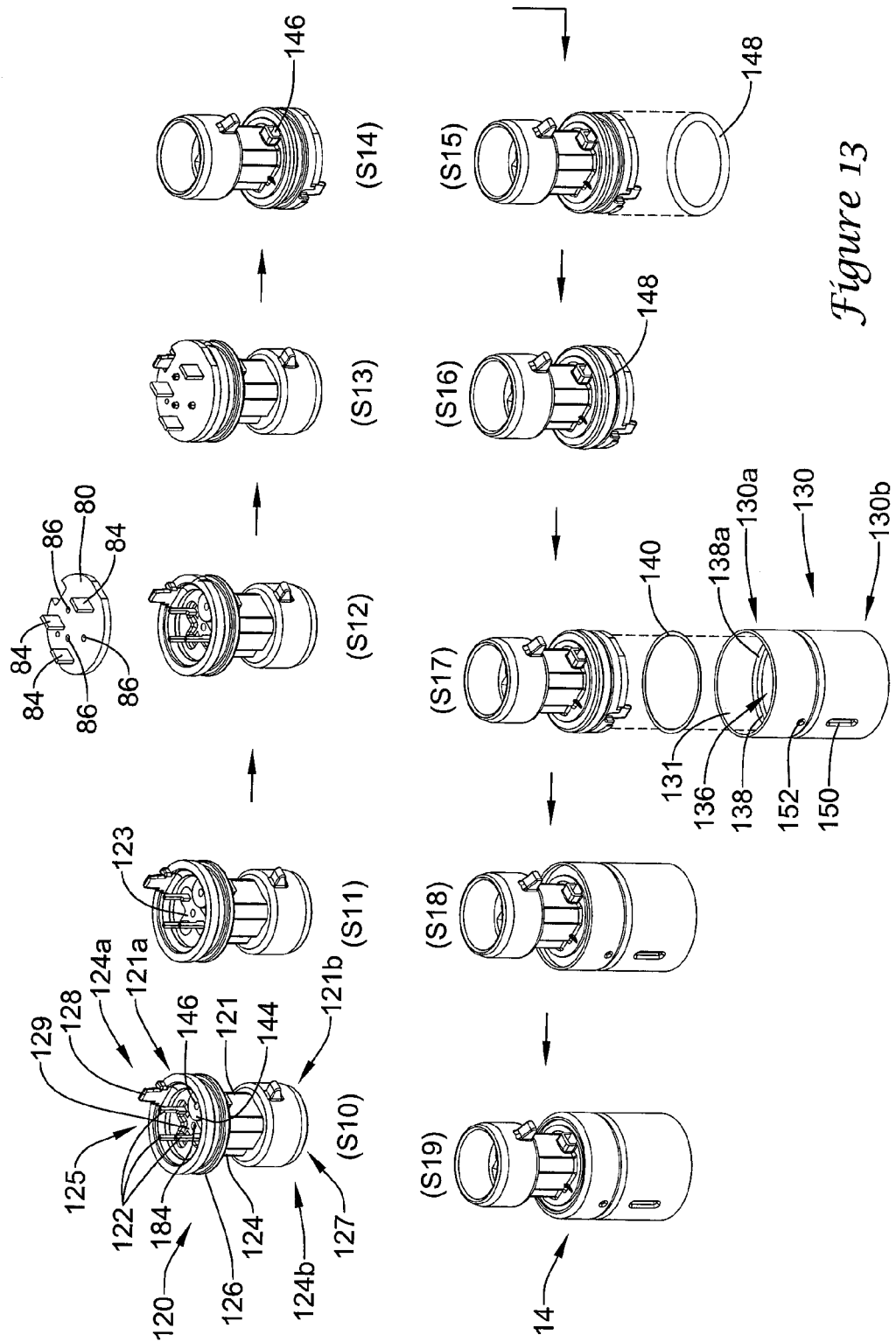
FIG. 13 is a flow diagram showing steps of an illustrative fabrication process for an illustrative electrical connector/housing subassembly.
Figure 15A:
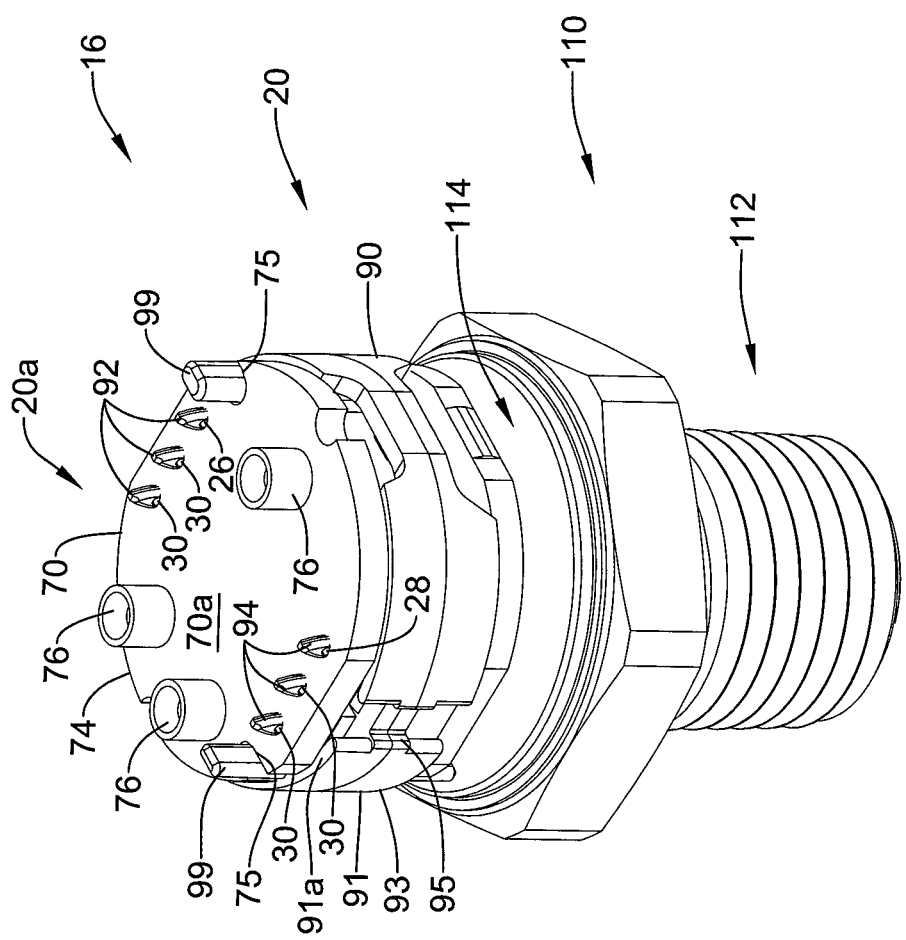
FIGS. 15A and 15B are perspective and exploded perspective views, respectively, of an illustrative sensor/port subassembly.
Figure 15B:
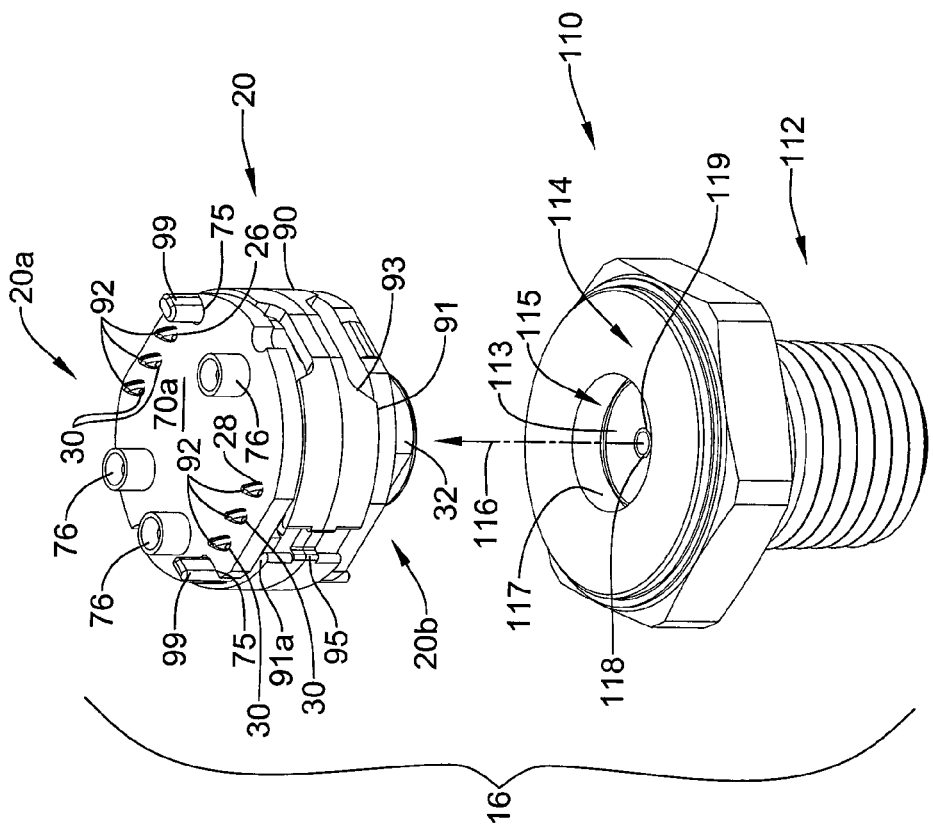
Figure 18:
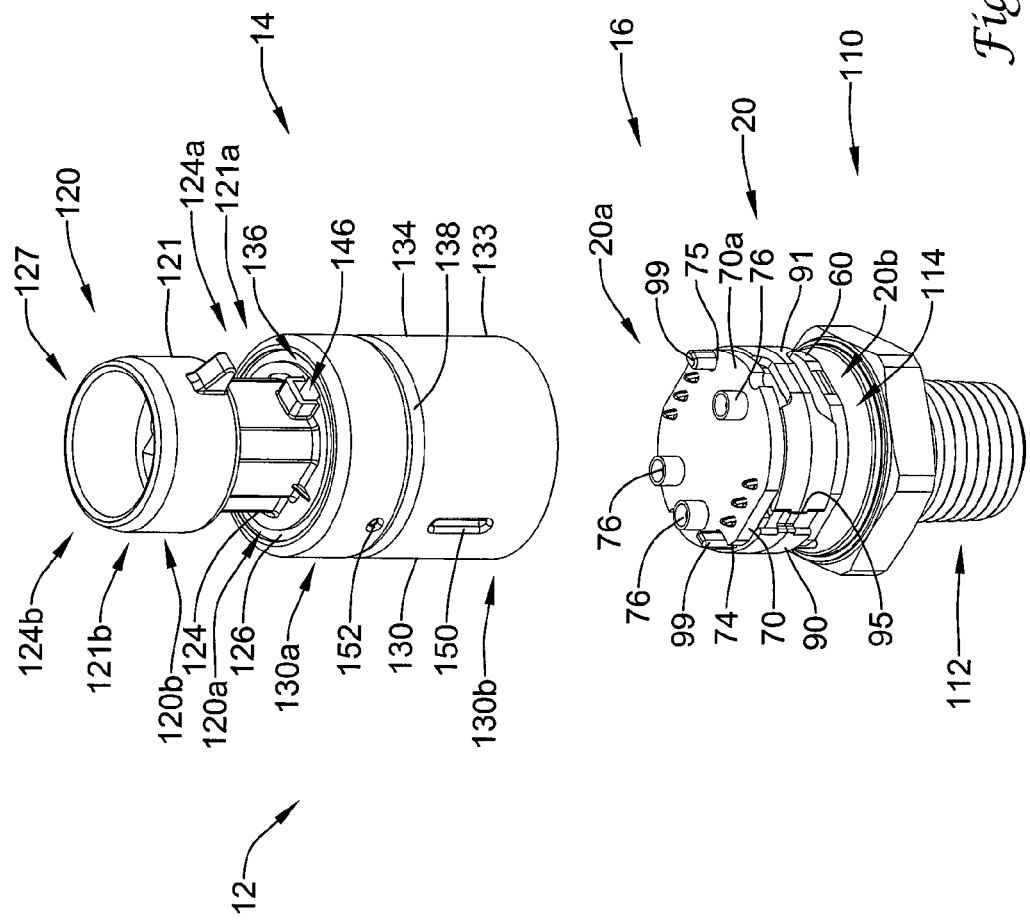
FIG. 18 is a partial exploded perspective view of an illustrative sensor assembly.

In some instances, parts of sensor assembly 10 may be assembled into various subassemblies, as discussed further herein. For example, a sensor housing subassembly 12, as seen in for example FIG. 18, may include pressure port 110, electrical connector 120 and an outer housing 130, among other features; a connector subassembly 14, as best seen in FIGS. 4 and 13, may include outer housing 130 and electrical connector 120, among other features; a pressure sensor sub-assembly 16, as best seen in FIGS. 15A and 15B, may include sensor unit 20 with a carrier 32 and pressure sensor 50, and pressure port 110, among other features; and a further sub-assembly, as best seen in FIGS. 7-10, which may be installed into sensor housing 12, may include sensor unit 20, among other features.

Sensor Unit

Figure 7:
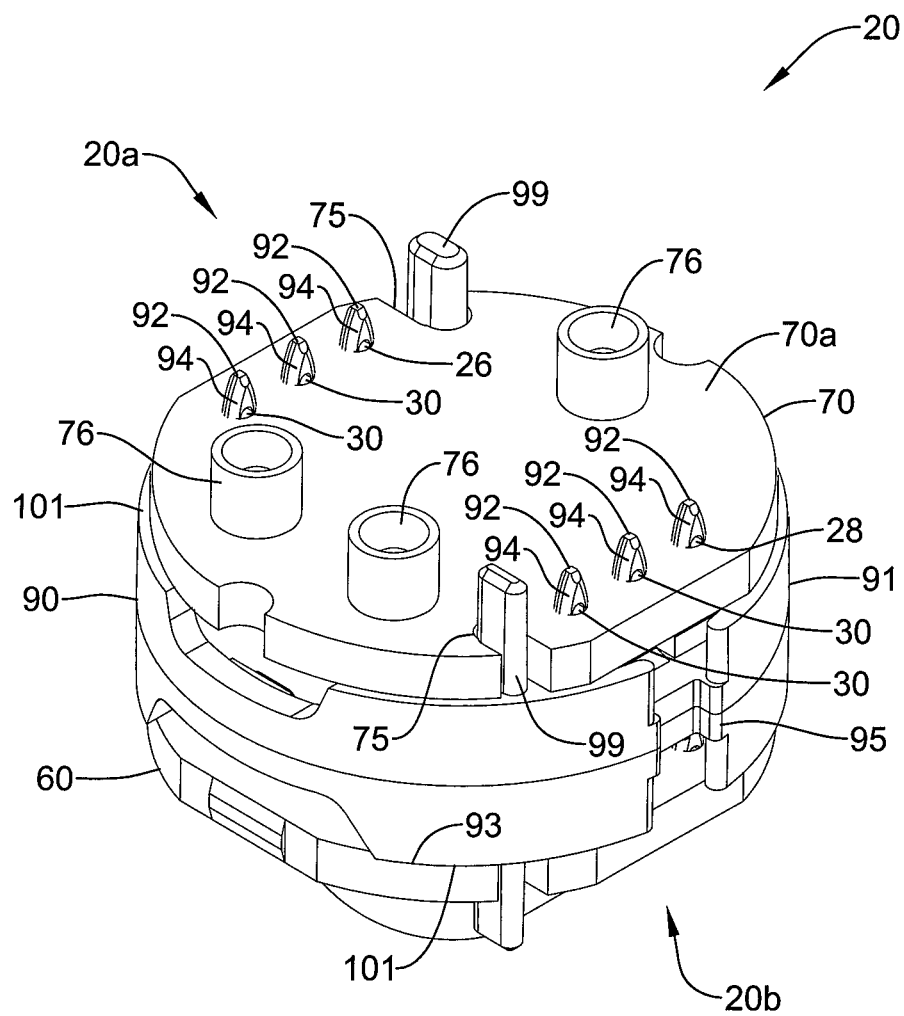
FIG. 7 is a perspective view of an illustrative sensor subassembly.
Figure 8:
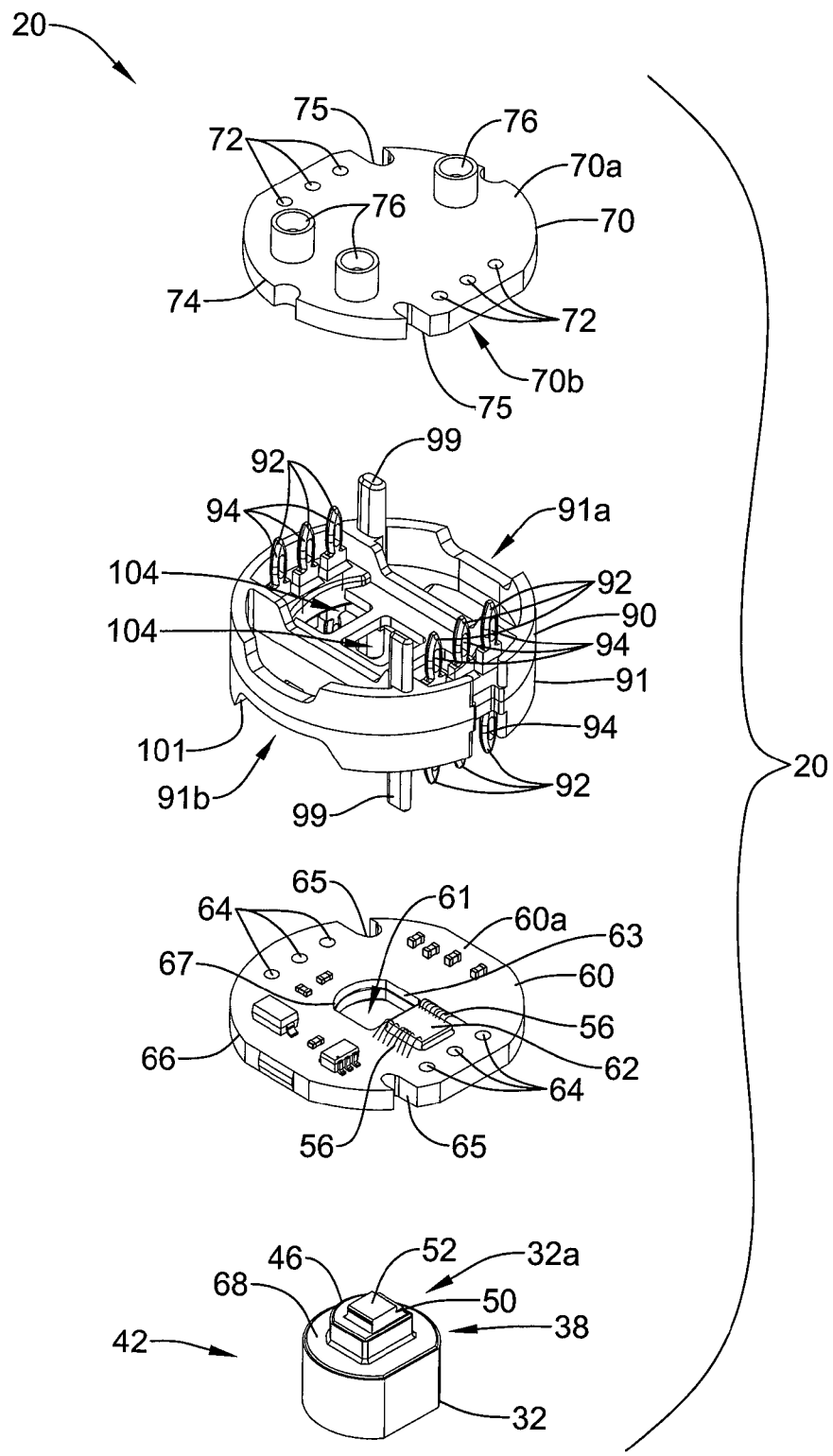
FIG. 8 is an exploded perspective view of the illustrative sensor subassembly of FIG. 7.
Figure 9:
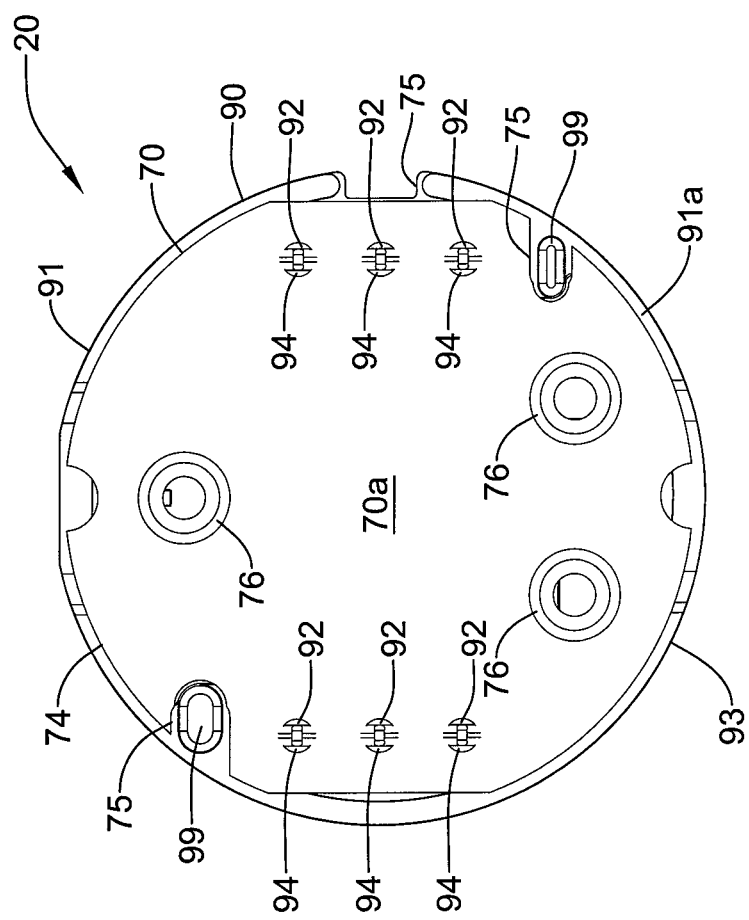
FIG. 9 is a top view of the illustrative subassembly of FIG. 7.

Generally, a pressure sensor unit subassembly or sensor unit 20, as seen in the illustrative embodiment of FIGS. 7-10, may include one or more electrical terminals 92, a carrier 32, a pressure sensor 50 including a sense element 52, a first printed circuit board (a "PCB") 60 that may at least partially define a second side 20b of the sensor unit subassembly 20, a second PCB 70 that may at least partially define first side 20a of the sensor unit sub-assembly 20, and a cover 90, among other features. When assembling sensor unit 20, cover 90 may be positioned between first PCB 60 and second PCB 70, as seen in FIG. 8, or at another desirable location capable of facilitating and maintaining a space between first PCB 60 and second PCB 70.

Figure 5:
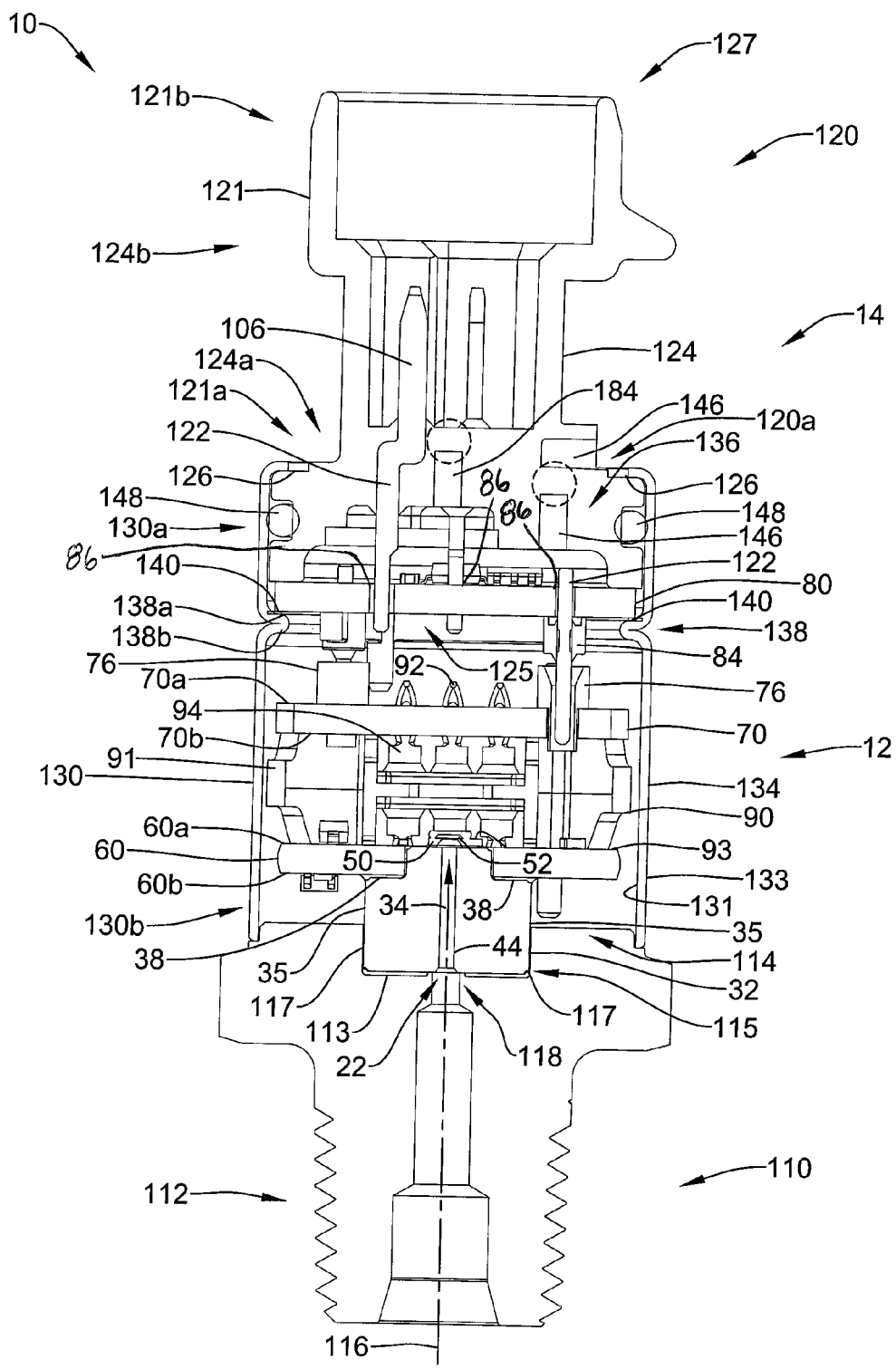
FIG. 5 is a schematic cross-sectional view of the illustrative sensor assembly of FIG. 3.

In some cases, sensor unit 20 may illustratively include pressure sensor 50 having pressure sense element 52 for measuring pressure of a fluid applied at pressure input port 22 and traveling through fluid path 34, where sense element 52 may provide one or more electrical pressure signals in response to sensing the pressure of the fluid applied at pressure input port 22 (e.g., see FIG. 5). In some cases, pressure sensor 50 including sense element 52 may be secured to first side 32a of carrier 32 in any manner. For example, pressure sensor 50 may be secured to carrier 32 through the use of an attach or an adhesive 54 or through another desirable connection technique such that pressure sense element 52 may be in fluid communication with fluid path 34 extending through carrier 32 (as depicted in FIG. 5). It is contemplated that any suitable adhesive 54 or attaching material may be utilized for connecting pressure sensor 50 to carrier 32 that facilitates allowing sense element 52 to maintain its connection to carrier 32 while not transferring an inordinate amount of stress to the sense element 52 when pressure is applied thereto.

Figure 6A:
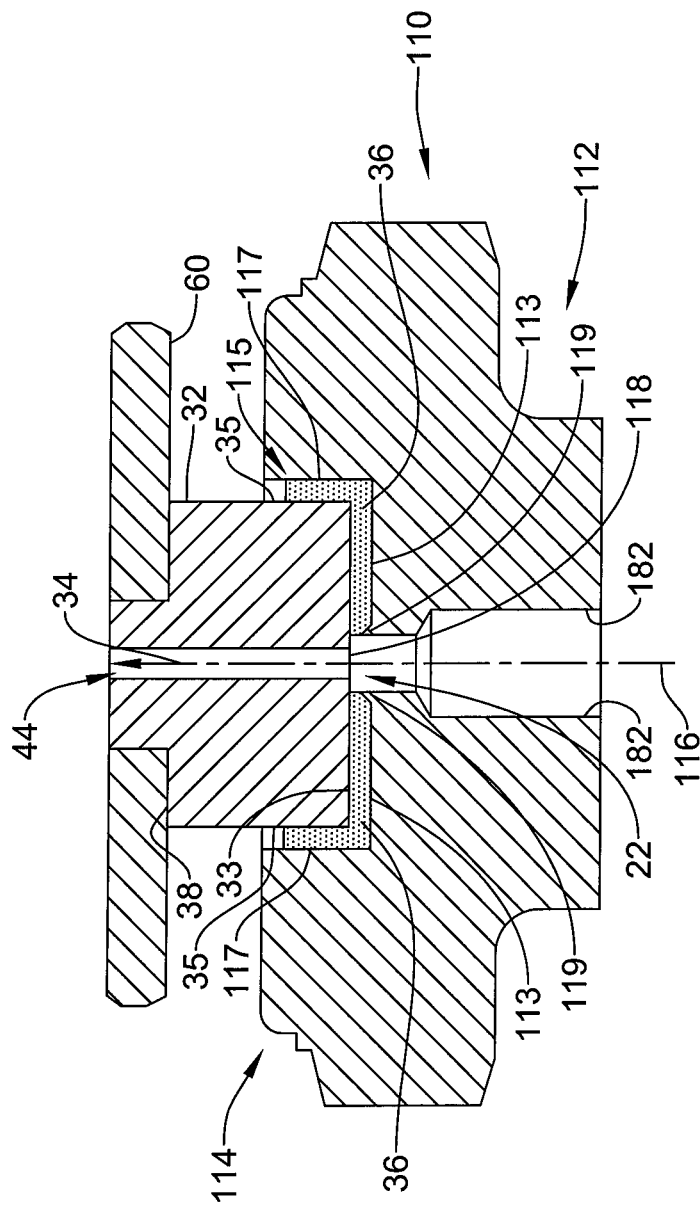
FIGS. 6A-6C are cross-sectional views of alternative illustrative connection features between a port and a carrier of an illustrative sensor assembly.
Figure 6B:
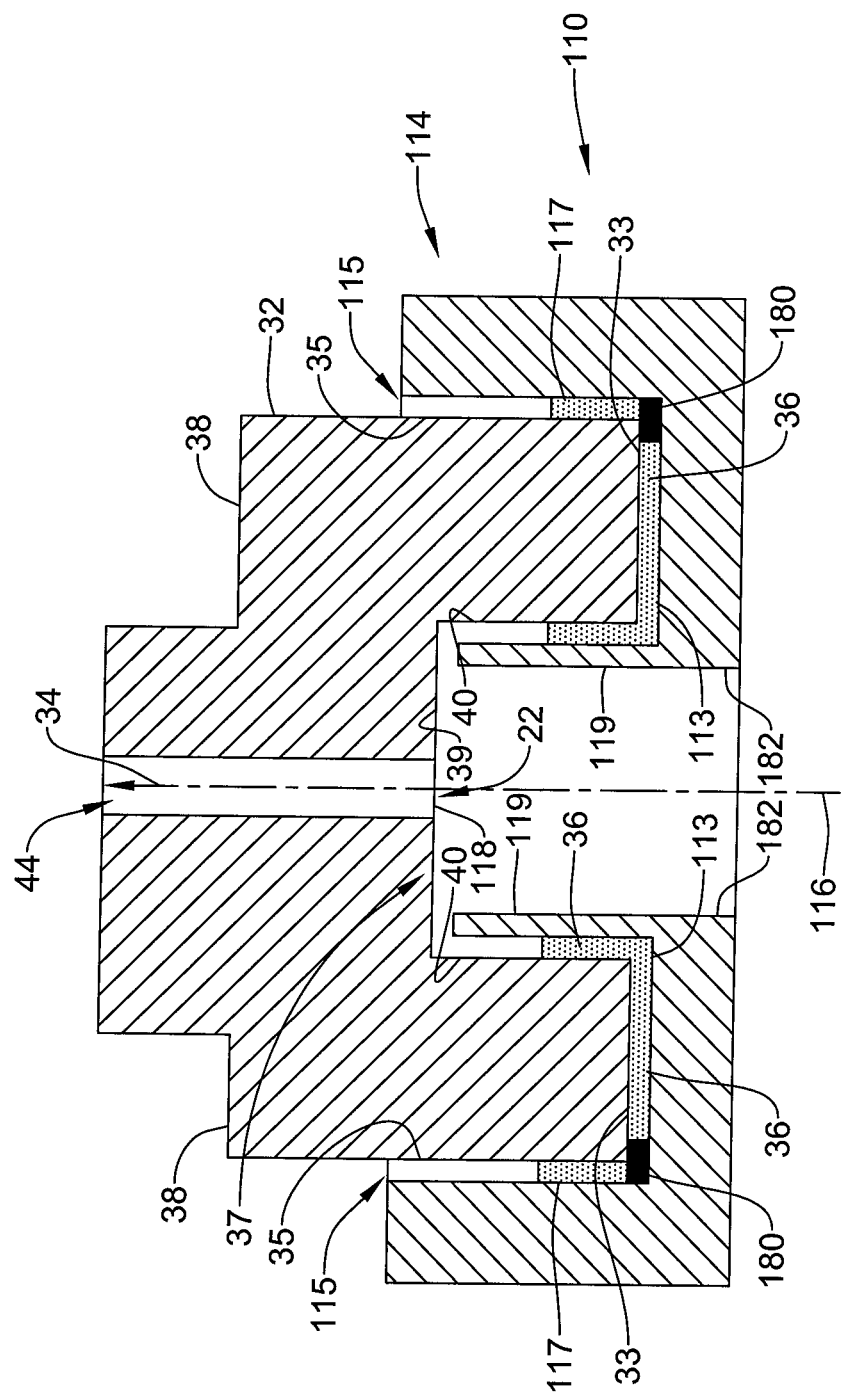
Figure 6C:
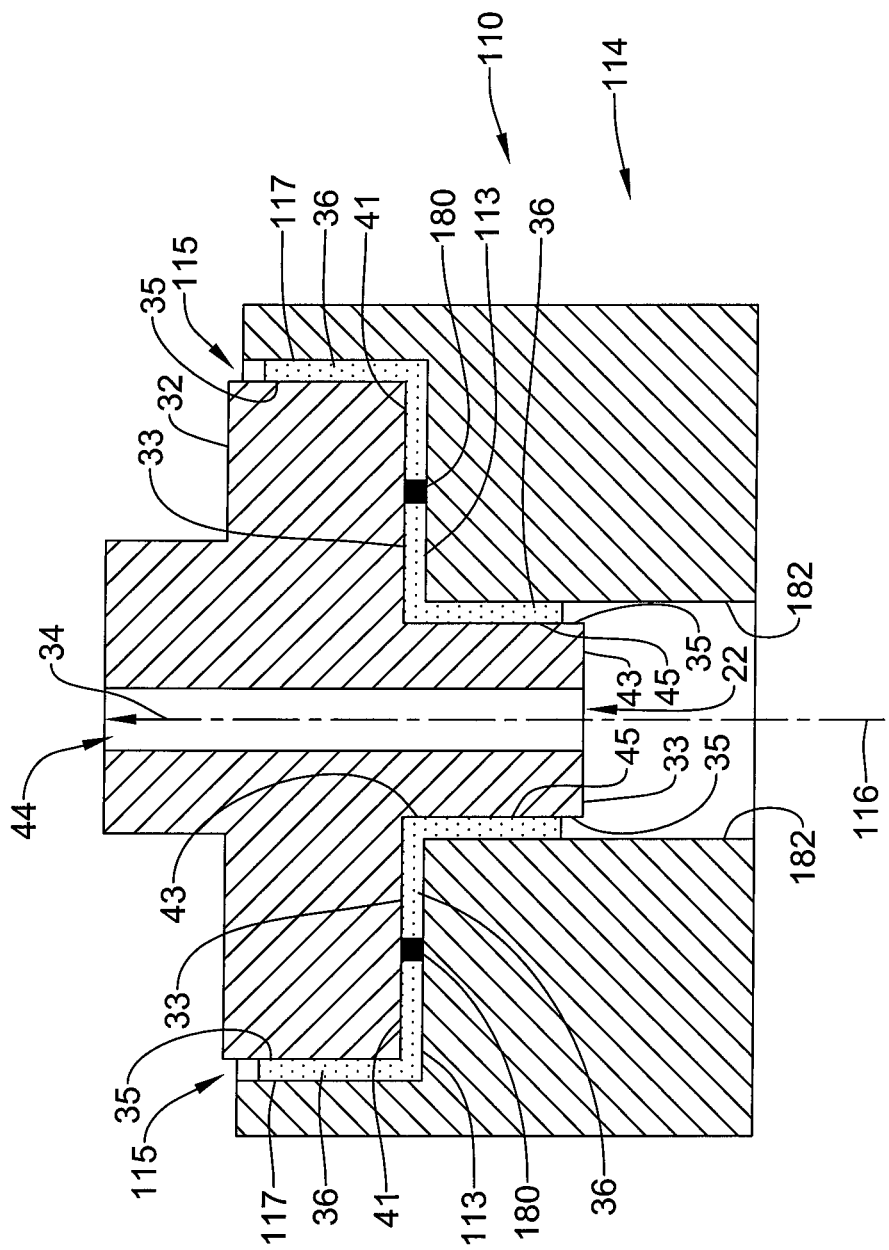
Figure 10:
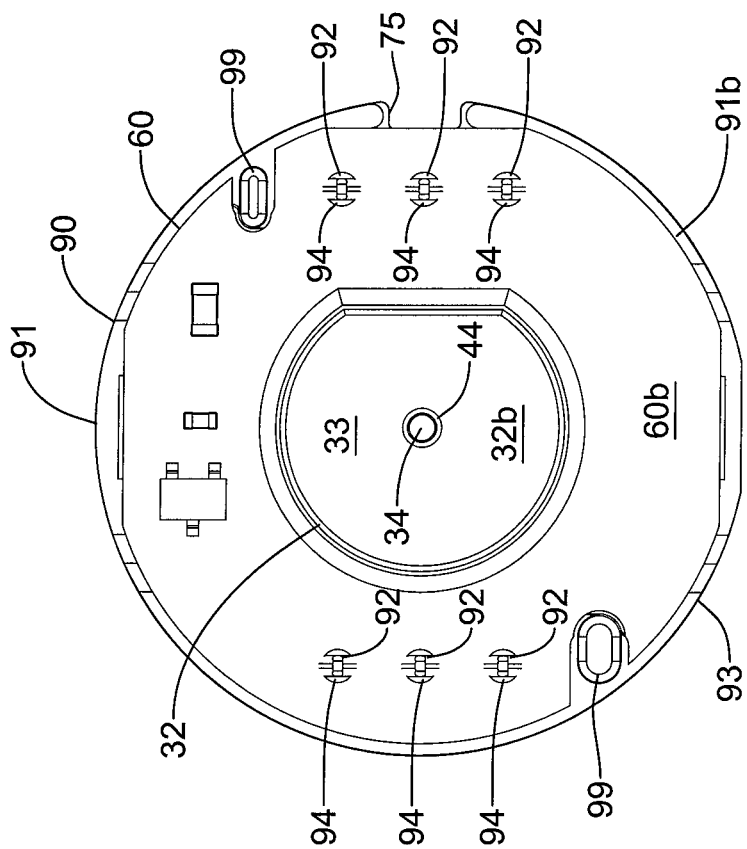
FIG. 10 is a bottom view of the illustrative subassembly of FIG. 7.

Carrier 32 of sensor unit 20 may have a first side or end 32a and a second side or end 32b having an opening extending from first side 32a to second side 32b, as best seen in FIGS. 5 and 10. Opening 44 may be at least partially defined by carrier 32 and opening 44 may create a carrier fluid path 34 that travels at least from an input port 22 to sense element 52 abutting or adjacent to opening 44 at first side 32a. Input port 22 may be located at or near second side 32b (e.g., an end of carrier 32 of sensor unit 20 that abuts or is connected to or is in communication with pressure port 110 and through which fluid path 34 may travel from pressure port 110 to sensor unit 20) having end face 33. As mentioned, sense element 52 may be positioned at or near first side 32a, which may be located at a side of carrier 32 substantially opposite second side 32b. End face 33 of carrier 32 may be at least substantially flat (e.g., at least substantially planar), as shown in FIG. 6A, or end face 33 may have a recess 37 therein defined by a bottom wall 39 and side walls 40, where bottom wall 39 may abut or intersect fluid path 34 and may be at least substantially flat (e.g., at least substantially planar) and non-coplanar with end face 33, as depicted in FIG. 6B. Alternatively, or in addition, second end 32b of carrier 32 may include a second shoulder 41 (a first shoulder 38 is discussed below) with a protrusion 43, where protrusion 43 may extend around fluid path 34 and may define at least part of fluid path 34, as seen in FIG. 6C. Moreover, protrusion 43 may be at least partially defined by fluid path 34 and side walls 35.

In some instances, carrier 32 of sensor unit 20 may include an alignment feature 46 for aligning carrier 32 with first PCB 60, as best seen in FIG. 8. For example, alignment feature 46 may be a shape of a part of a portion of carrier 32 that may engage first PCB 60. In the example shown, the shape of the part of the portion of carrier 32 engaging first PCB 60 may be rounded or have a curve while the remaining parts of the portion of carrier 32 engaging first PCB 60 have a different shape (e.g., a flat or straight shape), as best seen in FIG. 8. Alternatively, alignment feature 46 may include a flat part of the portion of carrier 32 engaging first PCB 60 while the other parts are rounded. Further, first PCB 60 may have an alignment feature 67 (e.g. aperture) corresponding to alignment feature 46 of carrier 32. Additionally, or alternatively, any other suitable alignment features may be used for aligning carrier 32 with first PCB 60, when so provided.

Carrier 32 of pressure sensor subassembly 16 may be formed in various shapes or configurations. In an illustrative example, second end 32b of carrier 32 may have various shapes or configurations; for example, second end 32b may be planar, may have one or more recess or may have one or more protrusion, as best shown in FIGS. 6A-C, or may take on other geometric shapes, sizes and configurations. The shapes and configurations of second end 32b may be such that second end 32b may be configured to engage or connect to an internal side 114 or end of pressure port 110. For example, second end 32b of carrier 32 may have an end face 33 and side walls 35, such that second end 32b of carrier 32 may extend into a recess 115 of pressure port 110. Such configurations may form a butt joint, a tube joint, a hole joint or other type of joint between carrier 32 and pressure port 110.

Further, carrier 32 may be made of any type of material. For example, carrier 32 may be made of a ceramic material or any other suitable material. In addition, and in some cases, at least a portion of end face 33 and/or bottom wall 39 may have a textured surface or non-textured surface, where a textured surface may facilitate adhering carrier 32 to pressure port 110. The textured surface may be formed using any suitable technique including, for example, one or more of an abrasive etch, grit blasting, a chemical etch, a laser etch, machining or other similar or different texturing technique.

In some instances, sensor unit 20 may include at least one printed circuit board (PCB). For example, sensor unit 20 may include a first PCB 60 and a second PCB 70, but this is not required in all embodiments. First PCB 60 may have a first side 60a and a second side 60b and a hole or opening 61 extending from first side 60a to second side 60b. Opening 61 may be any shape or size. For example, opening 61 may be a shape and size capable of receiving carrier 32 such that carrier 32 abuts an interior perimeter 63 of opening 61, or opening 61 may have any other desirable configuration consistent with the features of pressure sensor assembly 10. In some cases, first PCB 60 may include various electronic components and/or circuitry. For example, first PCB 60 may include an application specific integrated circuit (ASIC), a compensation circuit 62, and/or other electronic component(s). In one example, first side 60a of first PCB 60 may include compensation circuit 62 that may be electrically coupled to an output of the pressure sensor 50 for providing a compensated pressure sensor output signal, and/or first side 60a may include any other suitable circuitry. Further, with respect to the structural relationship of the other features of sensor unit 20, second PCB 70 may be vertically positioned or spaced above or from first PCB 60, as best seen in FIG. 8.

Referring to FIG. 8, lower PCB 60 may be connected to carrier 32 and the connection may be formed by any suitable connection technique. For example, first PCB 60 may connect to carrier 32 in a manner that allows first side 32a of carrier 32 and sense element 52 to extend through opening 61, such that pressure sense element 52 may be positioned adjacent first side 60a of first PCB 60, and a first shoulder 38 of carrier 32 may be positioned adjacent second side 60b of first PCB 60. Sense element 52 may be positioned adjacent first side 60a of first PCB 60 to facilitate wire bonding sense element 52 to first side 60a or it may be so positioned for another purpose. Further, first shoulder 38 may be permanently or semi-permanently connected to second side 60b of first PCB 60 through the use of a first PCB attach or adhesive or glue 68, or through any other suitable connection or adhering technique.

Second, upper PCB 70 may have a first side 70a and a second side 70b, where first side 70a may have one or more electro-mechanical clips 76. For example, one or more electro-mechanical clips 76 may be capable of engaging one or more electro-mechanical clip 84 of a third PCB 80 (e.g., see FIG. 2). Further, first side 70a of second PCB 70 may support a ground terminal 28, a power terminal 26, one or more pressure sensor output terminal 30 and one or more test pad (not shown) on or near first side 20a of sensor unit subassembly 20, as best seen in FIGS. 15A and 15B.

In some instances, first PCB 60 and/or second PCB 70 may include circuitry that may be configured to format the one or more pressure output signals provided by pressure sense element 52 into a particular output format. For example, circuitry of first PCB 60 and/or second PCB 70 (e.g., all of the circuitry may be on first PCB 60 or all of the circuitry may be on second PCB 70 or the circuitry may be on first PCB 60 and/or second PCB 70) may be configured to format the one or more than one pressure output signal provided by pressure sense element 52 into a ratio-metric output format, a current format, a digital output format and/or any other suitable format. In some cases, the circuitry of first PCB 60 and/or second PCB 70 may be configured to regulate an output voltage. Circuitry on first PCB 60 and/or second PCB 70 for providing a ratio-metric (or other) output may include traces and/or other circuitry that may serve as a conduit to test pads on the first side 70a of second PCB 70, and/or for providing the ratio-metric (or other) output to electrical connector 120, where the circuitry does not necessary reformat the output.

When a particular sensor unit 20 is selected to be installed in sensor housing 12, first PCB 60 and/or second PCB 70 may provide a formatted one or more pressure output signal (e.g., formatted into a first output format and/or a second output format that may be different than the first output format) to one or more selected electrical terminals 122 of electrical connector 120 via an electrical connection with one or more pressure signal output terminals 30. The circuitry on first PCB 60 and/or second PCB 70 may be configured to format the one or more pressure signals provided by pressure sense element 52 into multiple voltage or current formats. In addition, circuitry on first PCB 60 and/or second PCB 70 may be configured to regulate a power supply voltage incoming from electrical connector 120 prior to or before providing the regulated voltage to power pressure sense element 52.

Figure 11:
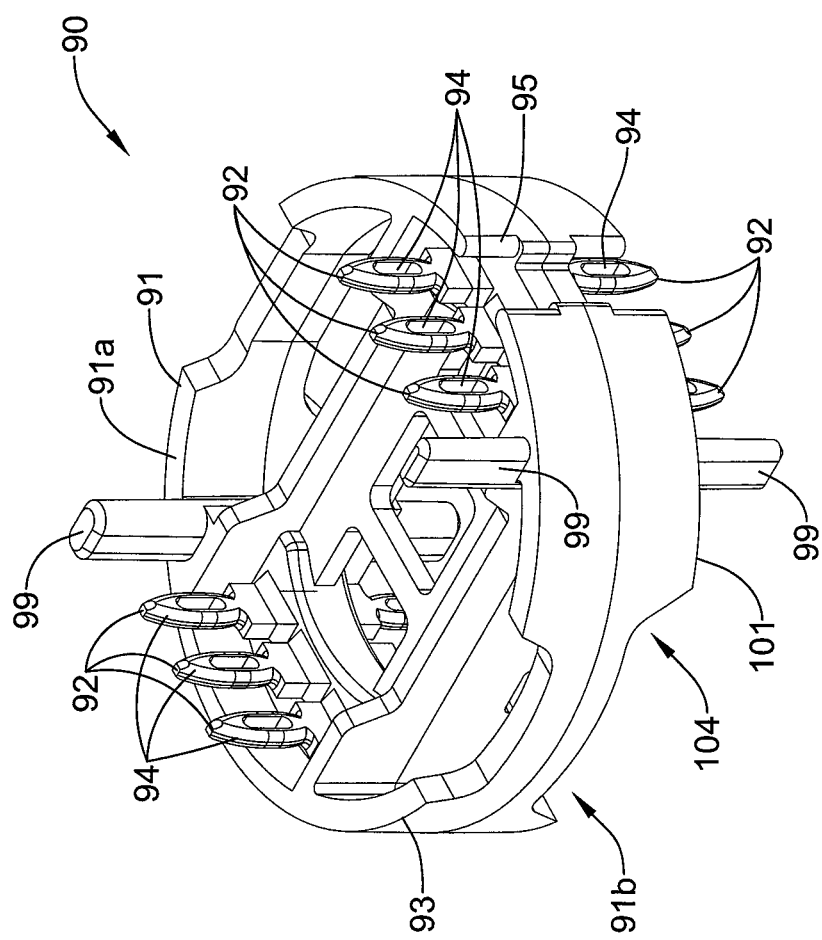
FIG. 11 a top perspective view of an illustrative protective cover of the illustrative subassembly of FIG. 7.
Figure 12:
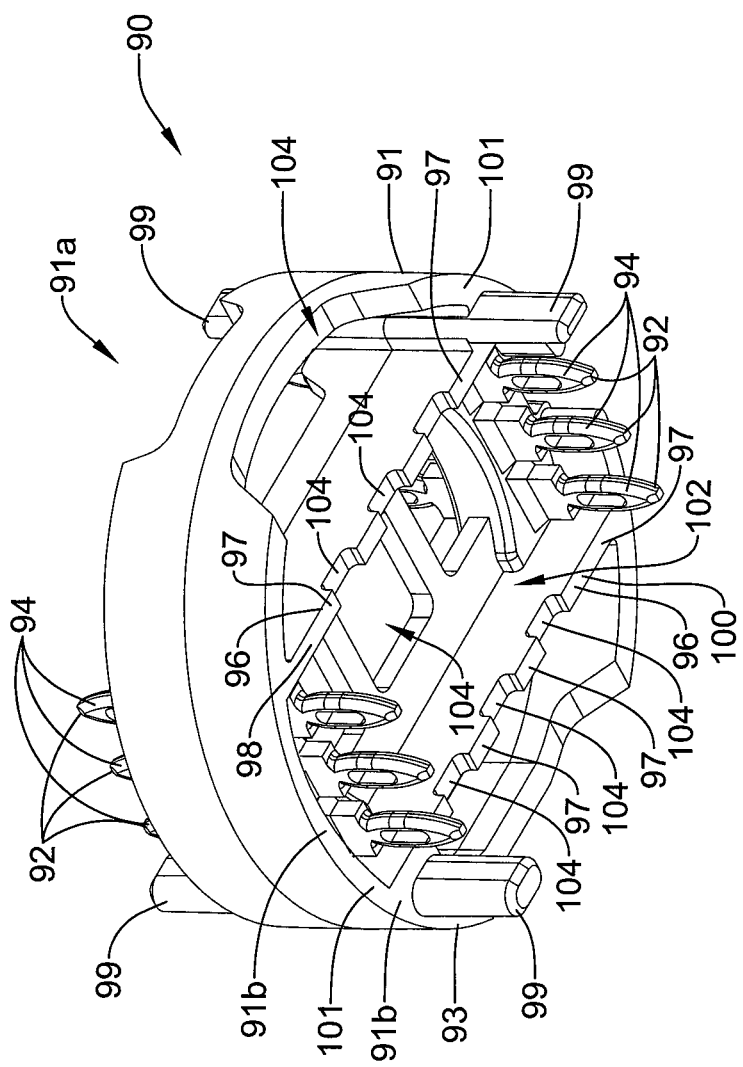
FIG. 12 is a bottom perspective view of the illustrative protective cover of FIG. 11.

In some instances, sensor unit 20 may include a cover 90, as best seen in FIGS. 11 and 12. Cover 90 may be positioned within sensor unit 20 between first PCB 60 and second PCB 70, as best seen in FIGS. 7-8. Cover 90 may be positioned such that it may act to maintain a mechanical spacing between first PCB 60 and second PCB 70, or cover 90 may be used for any other similar or different purpose. Cover 90 may have a body 91 having a first, upper side 91a and second, lower side 91b, where upper side 91a may be configured to contact or engage second PCB 70 at one or more locations and lower side 91b may be configured to contact or engage first PCB 60 at one or more locations. Further, and in some instances, body 91 may have a perimeter portion 93 that extends around a portion (e.g., a quarter, a half, at least a majority, etc.) of first PCB 60 and extends around a portion (e.g., a quarter, a half, at least a majority, etc.) of second PCB 70. Body 91 may be generally electrically insulating, but may include one or more electrical terminals 92 that may be capable of transmitting one or more electrical signal between first PCB 60 and second PCB 70. Electrical terminals 92 may be any electrical terminal configured to transmit one or more electrical signal between first PCB 60 and second PCB 70. For example, electrical terminals 92 may include compliant pins 94, which are discussed in greater depth in U.S. Pat. No. 7,458,274, issued on Dec. 2, 2008 to Lamb et al. and titled PRESSURE SENSOR INCORPORATING A COMPLIANT PIN, which is hereby fully incorporated by reference. Compliant pins 94 may be supported by body 91 (e.g., insert molded in body 91 or supported in another manner), as seen in FIGS. 11 and 12, and may extend into electrically conductive corresponding holes 64, 72 on first PCB 60 and second PCB 70, respectively. Compliant pins 94 may form electrical and mechanical connections with first PCB 60 and second PCB 70, as best seen in FIGS. 6-8. In some cases, compliant pins 94 may be the sole (e.g., only) mechanical mechanism that secures first PCB 60 to second PCB 70.

Cover 90 of sensor unit 20 may include body 91 having first side 91a (e.g., upper side) facing second side 70b of second PCB 70 and second side 91b (e.g., lower side) facing first side 60a of first PCB 60 (e.g., lower PCB), where one or more support features 96 may extend from at least second side 91b toward first PCB 60. Support features 96 may extend from second side 91b in any configuration and may provide support for first PCB 60 by spreading or dispersing out the force load while a fluid force is applied to pressure sensor 50 (e.g. without pressure port 110 connected). For example, support features 96 may extend from second side 91b in a manner such that support features 96 may be capable of at least partially contacting first side 60a of first PCB 60 and may be capable of extending across a portion (e.g., a quarter, a half, a majority, at least a majority, etc.) of first side 60a of first PCB 60. Further, support features 96 may contact first PCB 60 in such a manner so as to apply or transmit a force from second side 91b of body 91 to first PCB 60. It is contemplated that the force from second side 91b may be at least sufficiently large to hold pressure inlet/input port 22 of pressure sensor 50 on a pressure source exerting pressure at a level of pounds per square inch (PSI) of ten (10) PSI or any other PSI including, but not limited to, 1, 2, 4, 8, 10, 20, 40, 50, 100, 1000, 2000, 5000 PSI or more, for example, without effecting the accuracy of the output of the pressure sensor by more than 0.01 percent, 0.1 percent, 1 percent, 5 percent, 10 percent or more, as desired.

Support features 96 may include a first support feature 98, and a second support feature 100 that may be spaced (e.g., laterally spaced) from one another by a gap 102, as best seen in FIG. 12. Gap 102 may be configured to receive pressure sensor 50 and have pressure sensor 50 situated therein when cover 90 has been applied to first PCB 60, where cover 90 may provide mechanical protection from large, gross objects, or other objects, that may otherwise strike wire bonds 56 connecting sensor 50 to first PCB 60 and other devices interior to cover 90. Support features 96 may abut first side 60a along a substantial entirety of their path, or support features 96 may abut or contact first side 60a at two or more places using contacts 97 of support features 96. Further, support features 96 may also include a perimeter support feature 101. Further, support features 96,101 may at least partially define one or more openings or vents 104 in cover 90. Openings 104 may be utilized for any purpose, including but not limited to, allowing air to flow between first PCB 60 and second PCB 70 and to pressure sensor 50.

As second side 91b of body 91 of cover 90 may be configured or shaped to distribute forces that may be applied to first PCB 60 via support features 96 across first PCB 60, first PCB 60 may remain sufficiently flat and cause less than a particular percentage error in the output of pressure sensor 50 when cover 90 is applied to first side 60a and a pressure is applied to pressure sensor 50 (e.g. without a pressure port 110 attached to the carrier). The particular percentage error may be ten (10) percent (%) or less error in the output of pressure sensor 50, or another desirable limit on error including, but not limited to less than 0.001%, 0.01%, 0.1%, 1.0%, 2.0%, 5.0%, 10.0%, 20.0% or another level of error.

Sensor unit 20 may also include one or more PCB alignment features 99 capable of aligning cover 90 with first PCB 60 and/or second PCB 70. PCB alignment feature of cover 90 may extend from sides 91a, 91b of body 91 and engage or contact respective first and second PCBs 60, 70. PCB alignment features 99 may engage corresponding cover alignment features 65, 75 of first and second PCBs 60, 70, respectively.

In some instances, sensor unit 20 may include at least one exterior alignment feature 95 capable of engaging a first alignment feature 150 of outer housing 130 to align sensor unit 20 with outer housing 130, where outer housing 130 may or may not be part of a parent pressure sensor subassembly 16. Exterior alignment feature 95 of sensor unit 20 may be positioned on or near an exterior of cover 90; for example, exterior alignment feature 95 may be positioned on an exterior of cover 90, as best seen in FIG. 4. First alignment feature 150 of outer housing 130 may be positioned to engage or contact exterior alignment feature 95 of sensor unit 20 from an interior 131 of outer housing 130, also best shown in FIG. 4.

Sensor unit 20 may be formed or put together through the use of any suitable technique. For example, a carrier 32 may be provided and die attach 54 (e.g., glue or adhesive) may be applied to a top or first side 32a of carrier 32. After die attach 54 or other connection facilitating system has been applied to carrier 32, sense die or element 52 of pressure sensor 50 may be positioned on die attach 54 and then cured (if necessary) to make a permanent or semi-permanent connection therebetween. Once sense element 52 has been connected to carrier 32, first PCB attach 68 (e.g., glue or adhesive) or other connection facilitating system may be applied to first shoulder 38 of carrier 32 and first PCB 60 may be positioned on first shoulder 38 and cured (if necessary) in place. First PCB 60 may be connected to carrier 32 in any a manner. For example, second side 60b may be positioned on first PCB attach 68 on carrier 32 and accordingly, sensor element 52 and carrier 32 may be inserted through opening 61 so as to be adjacent first side 60a. After first PCB 60 has been placed on first PCB attach 68, first PCB attach 68 has been cured and first PCB 60 has been permanently or semi-permanently attached to carrier 32, sense element 52 may be connected to first side 60a in any electrically conductive manner. For example, bond pads of sense element 52 may be connected to bond pads on the first side 60a via wire bonding or any other similar or different technique. For example, two or more wire bonds 56 may be used to bond first side 60a of first PCB 60 to sense element 52. Wire bonds 56 may be free from contact with cover 90 while cover 90 engages first side 60a of first PCB 60. Cover 90 may engage electrically conductive holes 64 of first PCB 60 through compliant pins 94 extending from cover 90 toward first PCB 60. Further, electrically conductive holes 72 of second PCB 70 may engage cover 90 through compliant pins 94 extending from cover 90 toward second PCB 70. Once second PCB 70 has been electrically and mechanically connected to cover 90 and first PCB 60 through compliant pins 94, a sensor unit subassembly 20 may have been formed.

The structural relationships of features of sensor unit 20 described herein may be illustrative examples of embodiments and the structure may be organized in other relatively similar and advantageous manners that may allow sensor unit 20 to sense a pressure presented at pressure input port 22 and provide one or more pressure output signal on one or more pressure signal output terminals 30 electrically connected to electrical terminals 122 of electrical connector 120 when sensor unit 20 is installed within sensor housing 12, as best seen in FIGS. 2 and 5. Further, sensor unit 20 may be a subassembly as described or it may be considered a stand alone sensor capable of operating on its own or in another assembly, as sensor unit 20 may be considered a sensor capable of sensing and/or receiving a temperature, humidity, pressure, flow, thermal conductivity, gas concentration, light, magnetic fields, electric fields, as well as many other environmental parameters and providing an output proportional to or otherwise related to a presence of the condition or parameter being measured. In addition, sensor 20 may take on other configurations not explicitly discussed herein. For example, sensor 20 may have a differently configured pressure sensor 50 or sense element 52, such as a sensor having an oil-filled metal diaphragm or other design.

Pressure Port

Figure 16:
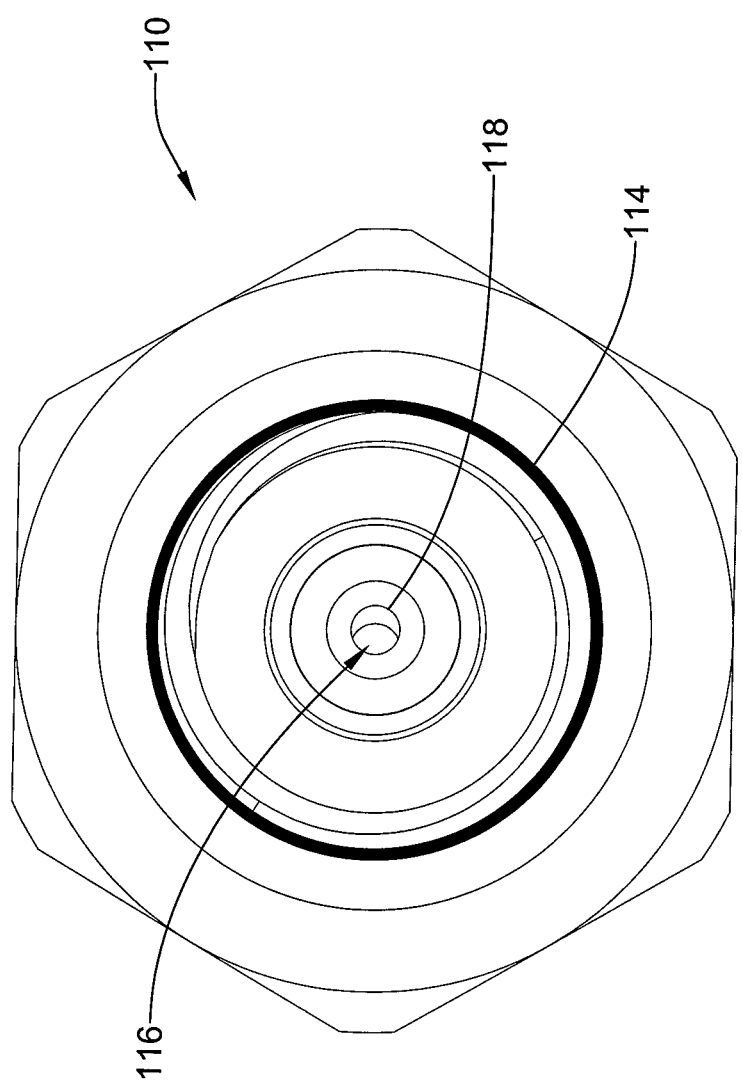
FIG. 16 is a bottom view of the port of the illustrative sensor/port subassembly of FIG. 15A.
Figure 17:
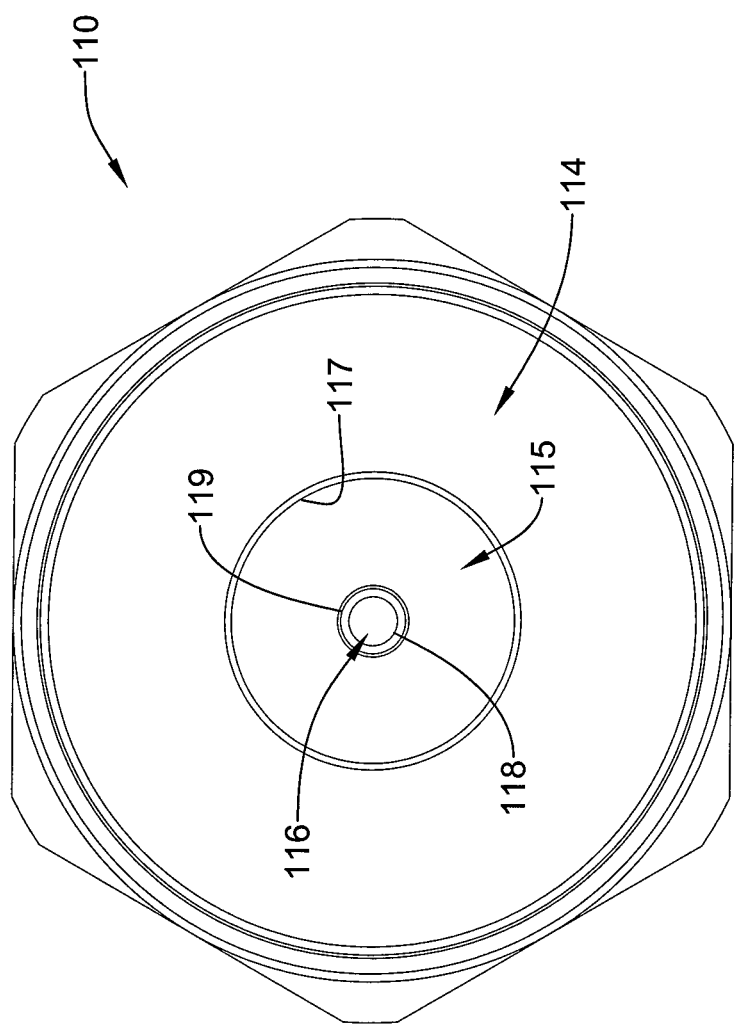
FIG. 17 is a top view of the port of the illustrative sensor/port subassembly of FIG. 16.

Pressure sensor assembly 10 may have pressure port 110 configured to be assembled with sensor unit 20, where pressure port 110 may at least partially define fluid path 116 extending from an external side 112 (e.g., a second side) of pressure port 110 to an internal side 114 (e.g., a first side) of pressure port 110, as best seen in FIGS. 15-17. Second side 32b of carrier 32 may be secured to pressure port 110 with respect to internal side 114, and fluid path 116 may align with fluid path 34 of carrier 32 such that fluid path 116 is in communication with fluid path 34.

In some instances, internal side 114 of pressure port 110 may have a recess 115, as best seen in FIGS. 6A-6C, 15B and 17. Recess 115 may be at least partially defined by a bottom wall 113 and side walls 117, where bottom wall 113 may intersect and/or may be adjacent to fluid path 116 of pressure port 110. In some cases, bottom wall 113 may include and/or define a lip 119 upwardly extending and/or extending toward carrier 32 when carrier 32 has been attached to pressure port 110. Lip 119 may be adjacent to and extend around fluid path 116 of pressure port 110, where lip 119 may define an upward end of fluid path 116 of pressure port 110, as best seen in FIGS. 6A, 6B and 17. Recess 115 of pressure port 110 may receive a portion of second end 32b of carrier 32 that may extend therein. When second end 32b has been extended into recess 115, end face 33 may be situated adjacent bottom wall 113 of recess 115, and side walls 35 of carrier 32 may be positioned adjacent to side walls 117 of recess 115, as best seen in FIGS. 6A-6C.

Pressure port 110 may be made out of any material. For example, pressure port 110 may be made out of aluminum, stainless steel, plastic or any other suitable material. In some cases, at least a portion of a bottom wall 113 of internal side 114 of pressure port 110 may have a textured surface or non-textured surface, where the textured surface may facilitate adhering pressure port 110 to carrier 32 and may be formed from one or more processes including, for example, an abrasive etch, grit blasting, a chemical etch, a laser etch, machining, and/or any other suitable texturing technique.

As discussed, pressure port 110 and carrier 32 may be assembled to at least partially form a pressure sensor subassembly 16 (e.g., see FIG. 4), where pressure port 110 may be a stainless steel and carrier 32 may be a ceramic, or pressure port 110 and carrier 32 may be made from other materials having similar or different properties. To facilitate the assembly, an adhesive layer 36 or other connection facilitating material may be situated in a first plane between end face 33 of carrier 32 and bottom wall 113 of recess 115 (e.g., see FIGS. 6A, 6B, 6C and 17). End face 33 and bottom wall 113 may be first surfaces of second end 32b and interior side 114, respectively, that may be substantially parallel (e.g., two parallel first surfaces). When pressure port 110 and carrier 32 are assembled, end face 33 may engage a lip 119 of bottom wall 113, such that lip 119 may define a spacing between end face 33 and bottom wall 113 and as a result, a thickness of adhesive layer 36 between end face 33 and bottom wall 113, as best seen in FIGS. 6A and 6B. Alternatively or in addition, a spacer element 180 may define or help define at least part of a thickness of adhesive layer 36 and/or a spacing between side walls 35 and side walls 117 and/or between second end face 33 and bottom wall 113 of pressure port 110 (e.g. see FIG. 6B) or at another location. In addition to adhesive layer 36 being disposed in a first plane between end face 33 and bottom wall 113 (e.g., between two substantially parallel or parallel first surfaces), adhesive layer 36 may extend up and between side walls 117 of recess 115 and side walls 35 of carrier 32 in a second plane at least substantially perpendicular to the first plane (e.g., between two substantially parallel or parallel second surfaces at least substantially perpendicular to the substantially parallel or parallel first surfaces), as shown in FIG. 6A, for example. In a further instance, when second end 32b of carrier 32 includes a recess 37 in end face 33 (e.g. see FIG. 6B), a bottom wall 39 may intersect fluid path 34, and recess 37 may receive at least a portion or part of lip 119 and bottom wall 39 may be spaced from lip 119 or may engage lip 119 (not shown). In this illustrative instance, adhesive layer 36 may extend up between side walls 40 of recess 37 and lip 119 extending upward.

In an illustrative example of a pressure sensor subassembly 10, carrier 32 may include a second shoulder 41 with protrusion 43 having side walls 45, as best seen in FIG. 6C. In this instance, when carrier 32 is assembled with pressure port 110, second shoulder 41 may extend along and adjacent to bottom wall 113, and protrusion 43 may extend into fluid path 116 such that fluid path 116, as may be defined by side walls 182, may be in fluid communication with fluid path 34. In this example, adhesive layer 36 may extend between at least side walls 45 and side walls 182. In this example and others, alternatively or in addition to pressure port 110 including lip 119, one or more of carrier 32 and pressure port 110 may define one or more spacer elements 180, where spacer elements 180 may define or help define at least part of a thickness of adhesive layer 36 between side walls 35 and 117 and/or between second shoulder 41 and bottom wall 113 of pressure port 110 or at another location, such as shown in FIG. 6C.

Adhesive layer 36 may be any adhesive capable of facilitating assembly of subassembly 16, such as an epoxy adhesive or other similar or different adhesives. Illustrative example adhesives may include, but are not limited to, EP1330 LV available from RESINLAB® having the ingredients of at least Bisphenol-A type epoxy resin, Diglycidyl ether of neopentyl glycol, cycloaliphatic/aliphatic amine, aluminum oxide, carbon black, and amorphous silicon dioxide; SUP10HT available from Masterbond and having the ingredients of epoxy phenol novalac (25%-50% by weight), aluminum powder (10%-25% by weight), flexibilizer epoxy resin (10%-25% by weight), curing agent (2.5%-10% by weight), siloxane treated silicon dioxide (2.5%-10% by weight), silicon dioxide, chemically prepared (≤2.5% by weight), and curing agent (≤2.5% by weight); and 1469 SCOTCH-WELD available from 3M® and having the ingredients of epoxy resin (70%-90% by weight), non-volatile amide (10%-30% by weight) and amorphous silica (1%-5% by weight), or other suitable adhesives as desired.

Electrical Connector

Figure 14A:
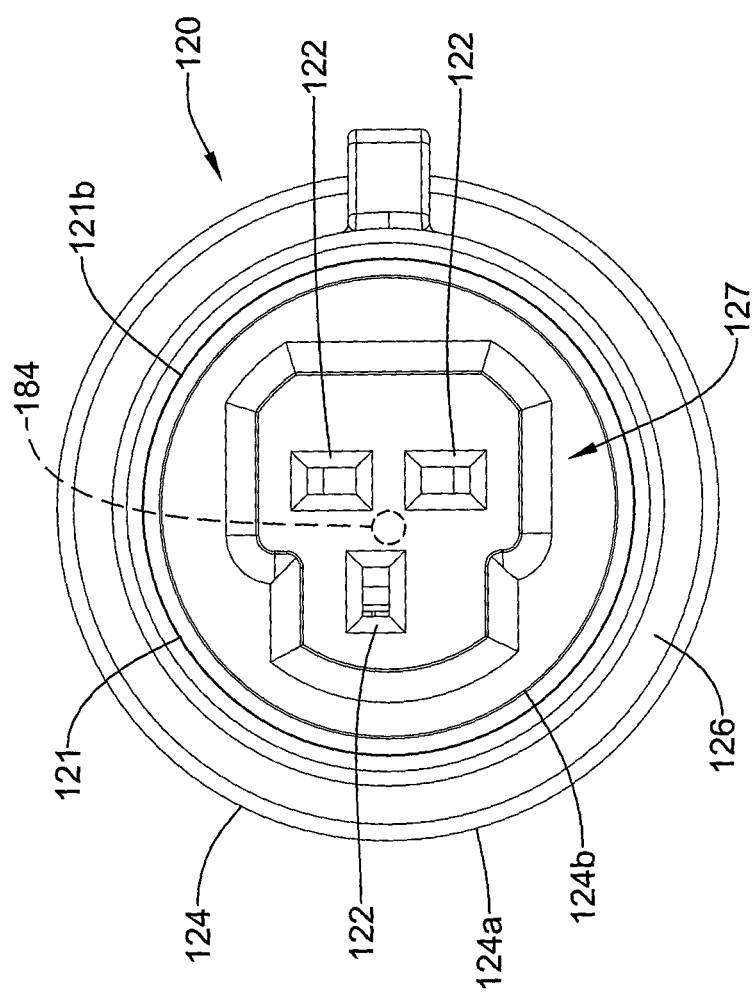
FIGS. 14A and 14B are top and bottom views, respectively, of the assembled illustrative electrical connector/housing subassembly of FIG. 13.
Figure 14B:
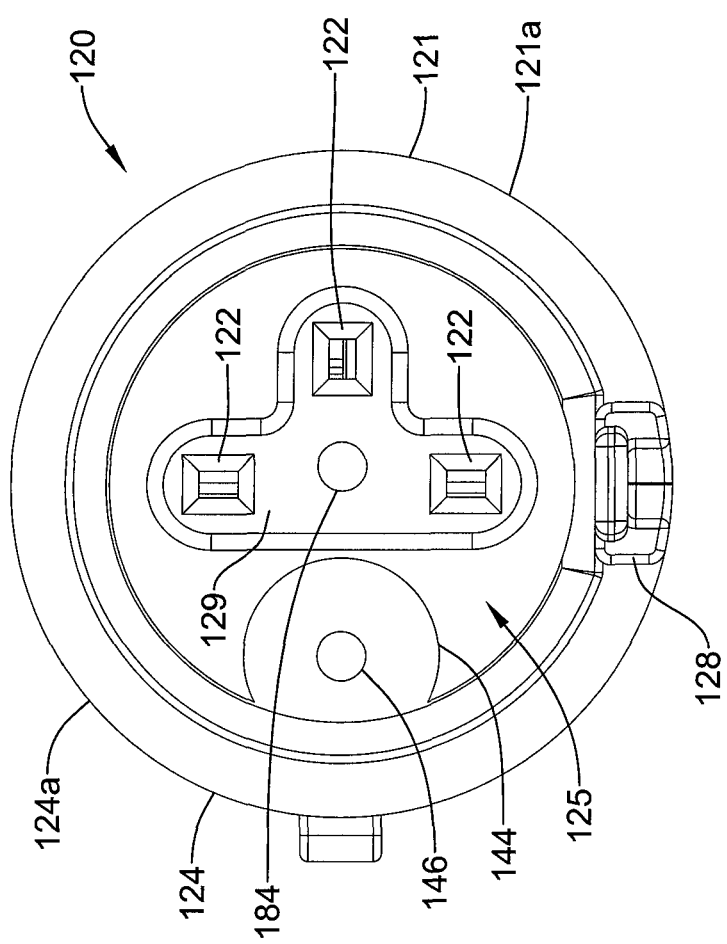

Pressure sensor assembly 10 may have an electrical connector 120 with a body 121 having a first end 121a (e.g., adjacent or near sensor interface 125) and a second end 121b (e.g., adjacent or near a cable interface 127), as best seen in FIGS. 13-14B, where body 121 may be made from any material. In one example, body 121 may be made from a plastic or metal or another similar or different material, as desired.

Electrical connector 120 may have at least a mechanical connector 124 with a first end 124a and a second end 124b and two or more electrical terminals 122, as best seen in FIGS. 2 and 5. In one example, two or more electrical terminals 122 may be exposed at first end 124a of mechanical connector 124 (see FIG. 14B) and two or more electrical terminals 122 may be exposed at second end 124b of mechanical connector 124 (see FIG. 14A). Further, one or more of electrical terminal 122 may face first end 121a or a sensor interface 125 and one or more of electrical terminal 122 may face second end 121b or cable interface 127, where electrical terminals 122 facing second end 121b and/or cable interface 127 may be compliant pins 106, as seen in FIGS. 2 and 5. Compliant pins 106 may be connected to connector body 121 in any manner; for example, compliant pins 106 may be insert molded in the electrical connector body 121. At least one of electrical terminals 122 may be electrically connected to one or more pressure signal output terminals 30 of sensor unit 20 and sensor unit 20 may be mechanically secured to first end 121a or sensor interface 125 of electrical connector body 121.

Figure 3:
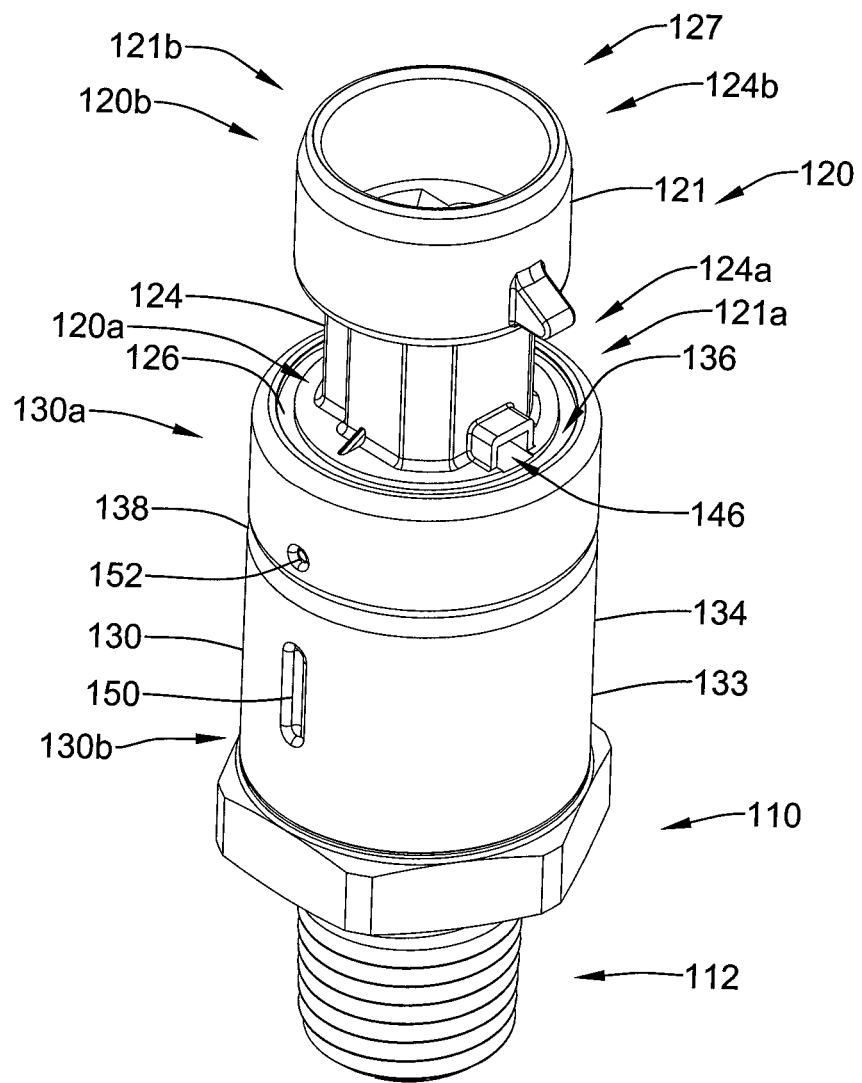
FIG. 3 is a perspective view of an illustrative sensor assembly.

In some instances, electrical connector 120 may include an alignment feature 128 for engaging a second alignment feature 152 of outer housing 130. Alignment feature 128 may engage or contact corresponding second alignment feature 152 of outer housing 130 at interior 131 of outer housing 130, as best depicted in FIG. 13. In addition, and in some instances, electrical connector 120 may include an external vent 146, as seen in FIGS. 3-5, where vent 146 may extend from outside of aperture 136 of outer housing 130 to an interior 131 of aperture 136 of outer housing 130. Further, and in some instances, electrical connector 120 may include an internal vent 184, as seen in FIGS. 5 and 13-14B. Internal vent 184 may extend from inside connector 120 and release into cable harness 160, such that exhausted fluid may be capable of flowing through cable 162 to an open atmosphere. As seen in FIG. 5, vents 146, 184 are depicted as being closed and the dotted circles adjacent vents 146, 184 represent areas of connector 120 where material may be removed to open vents 146, 184. In addition, FIG. 14A depicts internal vent 184 in a closed position and a dotted circle is placed between terminals 122 to represent a possible position of vent 184 if it were in an open position.

In some cases, a third PCB 80 (e.g., an electrical connector PCB) or more PCBs, may be included in pressure sensor assembly 10. In the illustrative example shown, third PCB 80 may be connected to and/or positioned within electrical connector 120 and may be connected or secured to electrical connector 120 in any manner at first end 121a of electrical connector body 121. For example, as seen in FIG. 13 (note, for clarity purposes only added features have reference numerals in each subsequent step of the flow), an electrical connector may be provided (S10), and in an optional step, potting material 123 may be inserted into terminal recess 129 (S11). Potting material 123 may be optionally used to fill or substantially fill recess 129 for any purpose. For example, potting material 123 may be inserted in recess 129 when internal vent 184 is in a closed position to create an environmental moisture seal and to increase the structural stability around terminals 122. Further, a filter (not shown) covering external vent 146 at or near or about ledge 144 interior to first end 121a of connector body 121 may be optionally utilized. For example, the filter covering external vent 146 may be utilized where vent 146 is open and creates a fluid path from an interior of outer housing 130 and connector body 121 to an exterior thereof. The filter optionally placed on external vent 146 may be any type of filter; for example, the filter may be a hydrophobic and/or oleophobic filter and/or the filter may be configured to filter out other non-desirable materials. After optionally adding potting material 123 and/or the filter to electrical connector 120, third PCB 80 (S12) may be mechanically secured to electrical connector 120 relative to first end 124a of mechanical connector 124 (S13 and S14). Third PCB 80 may be secured to electrical connector 120 through the use of compliant pins 106 or another mechanical connecting technique. In addition, third PCB 80 may be in electrical communication with one or more of the electrical terminals 122 of electrical connector 120. For example, third PCB 80 may have one or more terminals 86 electrically connected to corresponding terminals of the two or more electrical terminals 122 exposed at first end 124a of mechanical connector 124. Further, third PCB 80 may be in electrical communication with sense element 52 of carrier 32 of sensor unit 20 through one or more of the pressure signal output terminals 30. Third PCB 80 may include one or more sensor electrical terminals 86 configured to connect to sensor unit 20, where sensor electrical terminals 86 may be located at common locations relative to conductive outer housing 130 regardless of which electrical connector 120 may be utilized (e.g., electrical connectors 120 may take on various shapes and configurations of which a single electrical connector 120 may be selected for use in sensor assembly 10).

Third PCB 80 may be a multiple layer printed circuit board that includes a layer (not shown) that is substantially a metal layer (e.g. a ground layer). The metal layer, which may be a ground layer or may be used for any other purpose, may span across a portion (e.g., a quarter, half, majority, etc.) of third PCB 80 and may provide part of or facilitate providing, along with outer housing 130 and/or pressure port 110, an Electro Magnetic Interference (EMI) barrier (or a "Faraday cage") or shield around sensor unit 20. In some cases, circuitry may be provided on third PCB 80 to assist in protecting against EMI, signal noise, and/or Electro-Static Discharge (ESD). For example, third PCB 80 may include one or more filter component, where the one or more filter component may be electrically coupled to at least one of the one or more terminals 86 of third PCB 80, which are electrically connected to corresponding terminals 122 that are exposed at first end 124a of mechanical connector 124. The filter components may include, for example, one or more inductors, capacitors, filter capacitors, ESD diodes and/or any other components suitable for preventing or mitigating incoming and outgoing noise. Such filter components may be utilized to filter power signals (e.g. power and ground), pressure output signal(s) and/or any other signals of the pressure sensor.

Outer Housing

Pressure sensor assembly 10 may include outer housing 130, which may form at least a portion of connector subassembly 14, as seen in FIGS. 4 and 5. Outer housing 130 may have an interior 131, an exterior 133, a first end 130a and a second end 130b, where a wall 134 extending between first end 130a and second end 130b may define an aperture 136. In the illustrative embodiment shown, outer housing 130 may extend between pressure port 110 and electrical connector 120, and may be mechanically secured to mechanical connector 124 and electrically connected to the conductive metal layer of third PCB 80, sometimes via a wave spring as further described below. In some cases, sensor unit 20 may be disposed within a space defined by pressure port 110, electrical connector 120 and outer housing 130.

Outer housing 130 may be made from any suitable material. In some cases, outer housing 130 may be made out of an electrically conductive or another material, and outer housing 130 may be electrically connected to pressure port 110, as desired. There may be several purposes for utilizing outer housing 130. Those purposes may include, for example, providing or facilitating a Faraday cage or shield around sensor unit 20, providing a mechanical or protective shield over the sensor unit 20 to help protect the sensor unit from the external environment and/or debris.

In some instances, and as best depicted in FIG. 5, wall 134 of outer housing 130 may define a ridge 138 positioned between first end 130a and second end 130b of outer housing 130. Ridge 138 may extend inward into aperture 136 and may have a first surface 138a facing or directed generally toward first end 130a and a second surface 138b facing or directed generally toward second end 130b. Wall 134 may define aperture 136 such that third PCB 80 and at least a portion or part of mechanical connector 124 may extend through first end 130a of conductive outer housing 130 and into aperture 136. First surface 138a of ridge 138 may act as a stop to stop the insertion of third PCB 80 and mechanical connector 124 into aperture 136. Further, an o-ring 148 may be positioned or inserted on electrical connector 120 at first end 124a (S15 and S16), as seen in FIG. 13. O-ring 148 may provide a seal between mechanical connector 124 of electrical connector 120 and interior 131 of outer housing 130.

Further, and in some instances, a conductive wave spring 140 may be provided (S17) and situated or inserted between first surface 138a of ridge 138 and a conductive region of the third PCB 80 (S17 and S18) so as to electrically connect the outer housing 130 with the ground plane of the third PCB 80, as seen in FIG. 13. Wave spring 140 may be inserted between first surface 138a and third PCB 80 prior to or when sliding electrical connector 120 into aperture 136 of outer housing 130 or at another time, such that one or more conductive regions of third PCB 80 electrically connect wave spring 140 to the ground layer of the third PCB 80. In this construction, wave spring 140 may provide or facilitate an electrical connection between outer housing 130 and the conductive ground layer of third PCB 80. Once wave spring 140 and electrical connector 120 have been inserted into aperture 136 of outer housing 130 (S18), outer housing 130 may be formed (bent) around a shoulder 126 of mechanical connector 124 (S19). Such a forming step may keep electrical connector 120 in place between ridge 138 and the formed portion of outer housing 130 at first end 130a.

Cable Harness

Pressure sensor assembly 10 may include a cable harness 160, as best shown in FIGS. 1, 2, 22 and 23. Cable harness 160 may include a cable 162 having a first end 162a and a second end 162b opposing first end 162a, where cable 162 may include one or more wires 164 extending between first end 162a and second end 162b of cable 162. In some cases, cable 162 may also include a cable sleeve 163 that may extend around wires 164 for at least a portion (e.g., a quarter, a half, a majority, more than a majority, etc) of a length of cable 162.

Cable harness 160 may include a cable cover 166 (e.g., see FIGS. 2 and 19-23) having a first end 166a and a second end 166b at an opposing end from first end 166a, with a wall 168 defining cavity 172, where wall 168 may extend from second end 166b toward, but possibly not all the way to, first end 166a (e.g., see FIGS. 2, 19, 22 and 23). Second end 166b of cable cover 166 may be connected or secured, in a mechanical or other manner, to second end 121b or cable interface 127 of electrical connector body 121. For example, second end 166b cable cover 166 may overlap and may be secured to second end 121b or cable interface 127 of electrical connector body 121 through forming a joint by heat staking, thermal welding, ultrasonic welding, an adhesive, and/or using any other suitable connecting technique. It is contemplated that cable cover 166 may be made from any suitable material; for example, cable cover 166 may be a plastic or a metal or a similar or different material, as desired.

Figure 20:
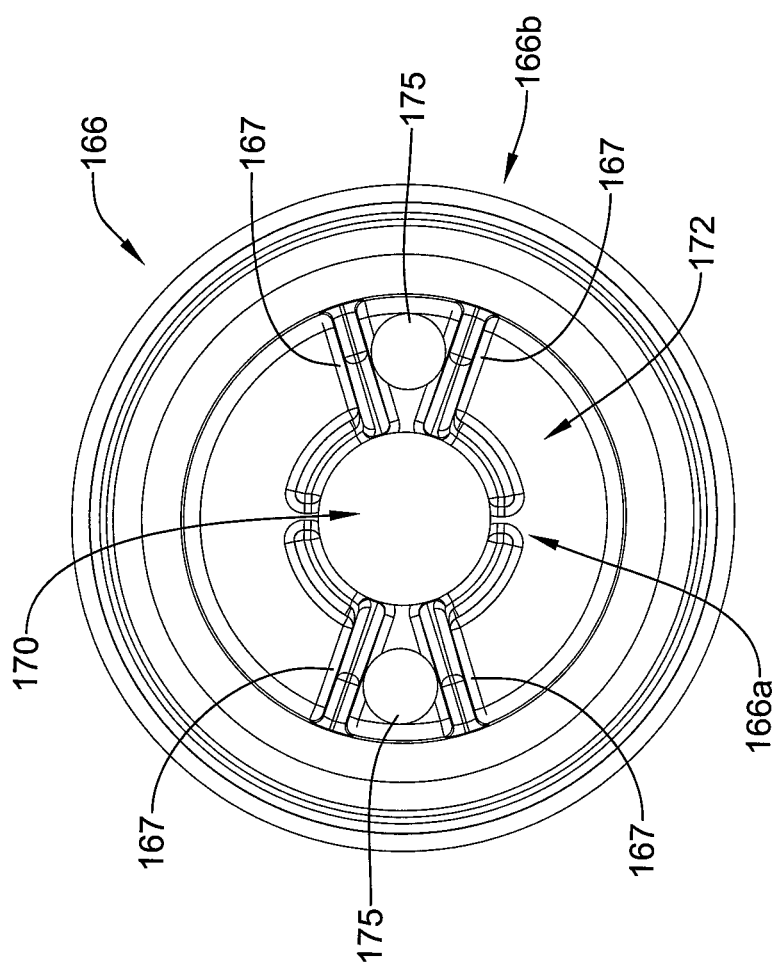
FIG. 20 is a bottom view of the illustrative cable cover of FIG. 19.
Figure 21:
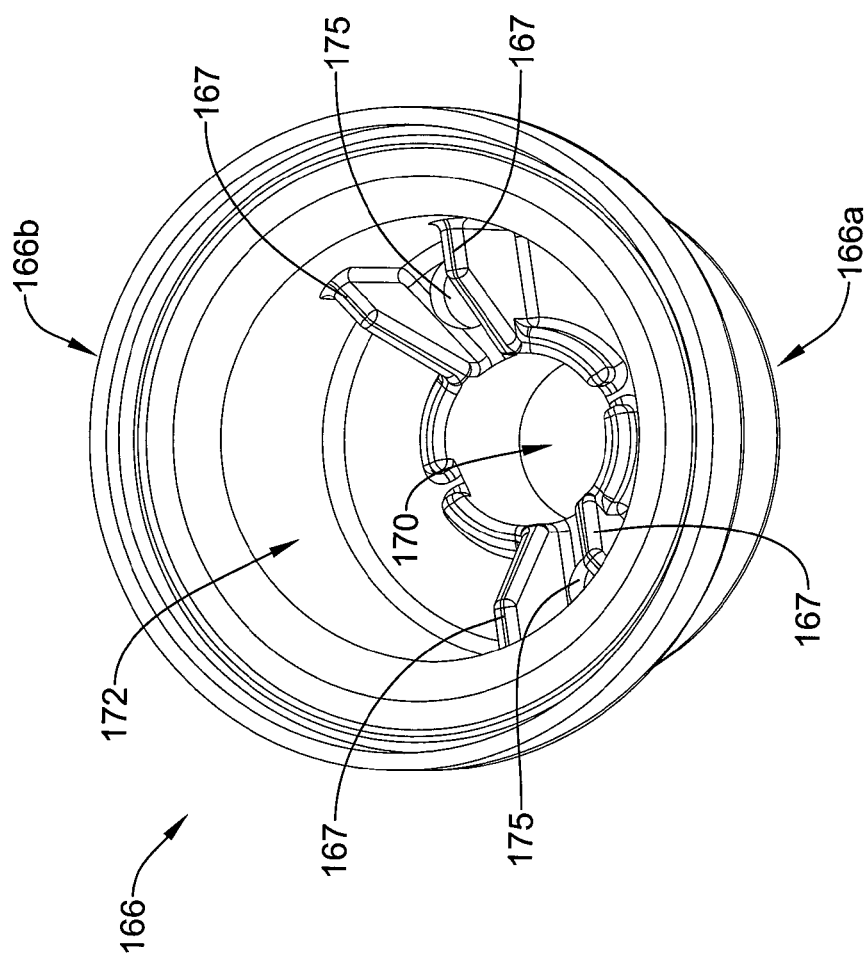
FIG. 21 is a bottom perspective view of the illustrative cable cover of FIG. 19.
Figure 22:
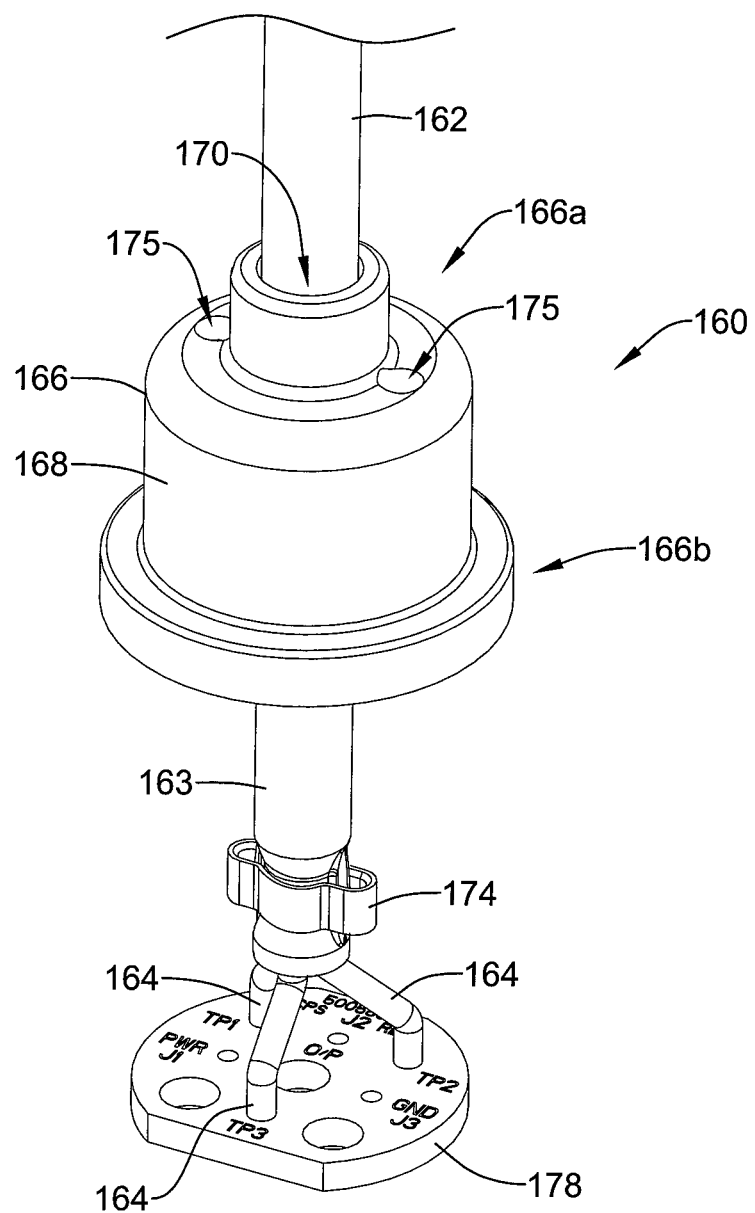
FIG. 22 is a partial top perspective view of the illustrative cable harness of FIG. 1.
Figure 23:
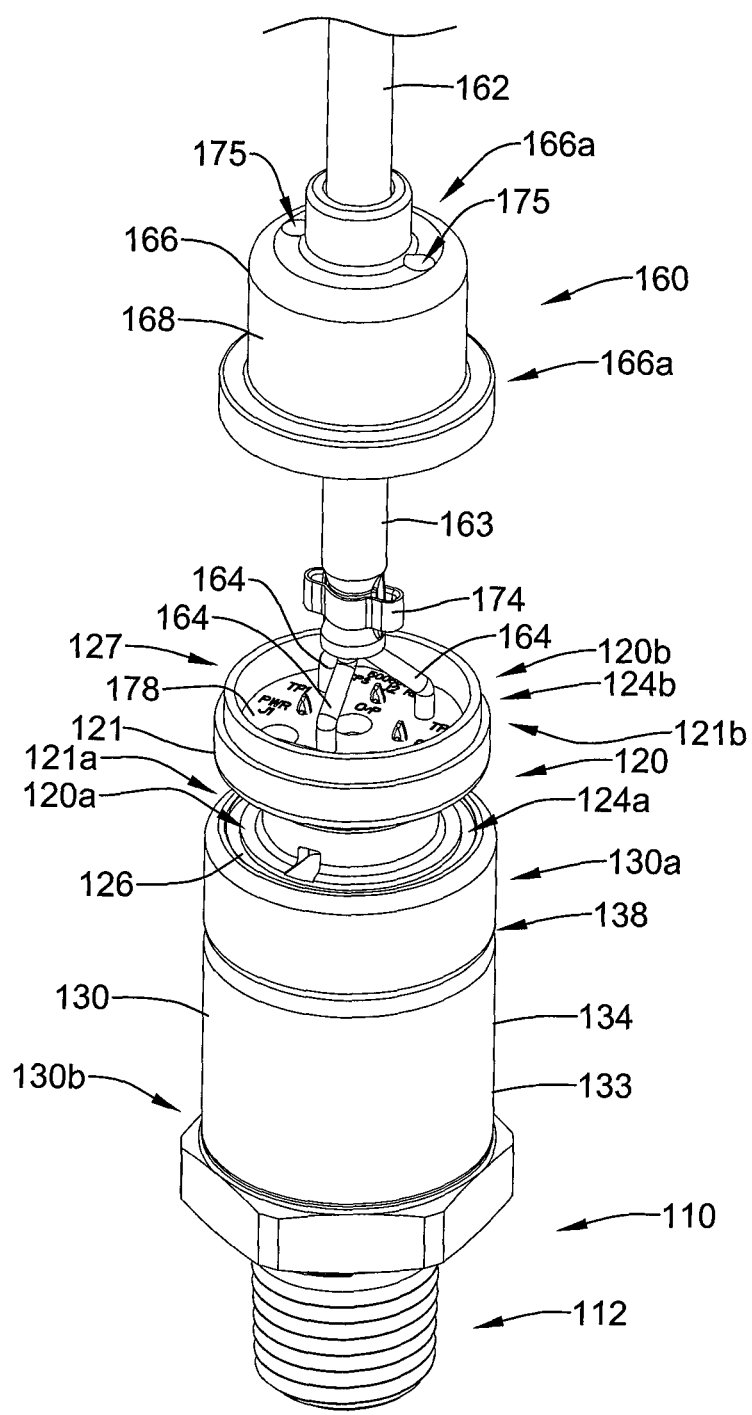
FIG. 23 is a partial top perspective view of the illustrative sensor assembly and cable harness of FIG. 1.

Cable cover 166 may include one or more rib 167 inside cavity 172 and near or adjacent to a cable receiving opening 170 that may extend from first end 166a of cable cover 166 into cavity 172, as best seen in FIGS. 20 and 21. First end 162a of cable 162 may extend through cable receiving opening 170 in cable cover 166, and a first end of wires 164 may be electrical connected to one or more than one electrical terminals 122 facing the second end 121b of electrical connector body 121.

Cable 162 may be secured within cavity 172 by crimping a crimp ring 174 around and to cable 162 at a distance from first end 162a of cable 162 (e.g., see FIGS. 22 and 23) or through another securing technique. Crimp ring 174 may be placed around cable sleeve 163 extending through cable receiving opening 170 of cable cover so as to secure cable sleeve 163 to wires 164, as best seen in FIG. 2. Crimp ring 174 may be positioned on cable 162 within cavity 172 and sized so as to not be capable of passing through cable receiving opening 170. It is contemplated that crimp ring 174 may engage at least one rib 167 inside the cavity 172 of cable cover 166 to assist or help prevent cable 162 from rotating relative to cable cover 166.

Figure 19:
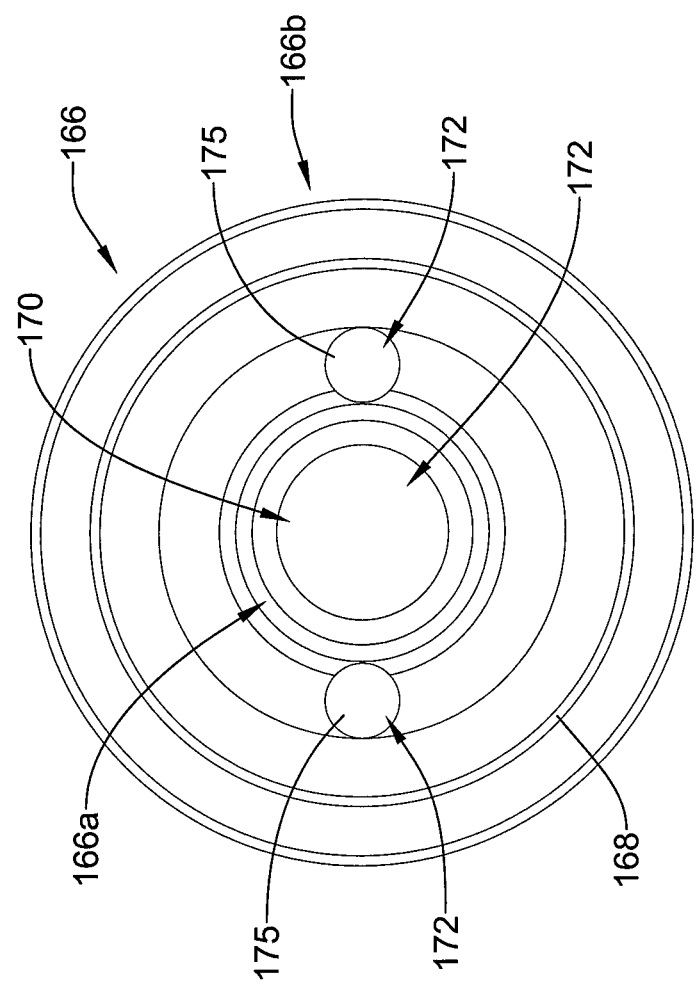
FIG. 19 is a top view of an illustrative cable cover of the illustrative cable harness of FIG. 1.

Cable harness 160 may also include potting holes 175 extending into cavity 172 of cable cover 166, as best shown in FIGS. 19 and 20, through which a potting material 176 (e.g., an electrically non-conductive epoxy liquid material or other non-conductive material capable of being used to fill a cavity) may be inserted to fill or substantially fill the open space of cavity 172. Cavity 172 may be filled at anytime; for example, cavity 172 may be filled after second end 166b of cable cover 166 has been secured, attached or connected to second end 121b of electrical connector body 121. Potting material 176 may be used for any purpose; for example, potting material 176 may be used to create an environmental moisture seal and/or for structural stability within cable cover 166.

As alluded to, in an illustrative example, cable harness 160 may be assembled by inserting first end 162a of cable 162 through a cable receiving opening 170 in cable cover 166. Further, crimp ring 174 may be secured at a distance from first end 162a of cable 162 such that crimp ring 174 may fit within cavity 172, but not through cable receiving opening 170. This may help prevent the first end 162a of the cable 162 from being pulled out of the cable receiving opening 170. The assembly may include electrically connecting the first end 162a of cable 162 to one or more electrical terminal 122 of electrical connector 120 and securing the second end 166b of cable cover 166 to second end 121b of electrical connector body 121. After connecting the cable cover 166 and electrical connector body 121 and making an electrical connection between terminals 122 and first end 162a of cable 162, cavity 172 of cable cover 166 may be filled or substantially filled with potting material 176 through potting holes 175 in cable cover 166 or through another opening in cable cover 166. As mentioned, potting material 176 may be used to provide an environmental moisture seal and/or to add structural stability to cover 166 or the structure, in general.

First end 162a of cable 162 may be connected to one or more electrical terminal 122 through a harness PCB 178 of electrical connector 120, where one or more wires 164 at first end 162a of cable 162 extending through cable receiving opening 170 may be electrically connected to harness PCB 178, as best seen in FIG. 2. Harness PCB 178 may be electronically connected to one or more of the electrical terminals 122 (e.g., one or more of the compliant pins 106) facing second end 121b or cable interface 127 of body 121 of electrical connector 120. Electrical terminals 122 facing second end 121b or cable interface 127 of body 121 may include compliant pins 106. Compliant pins 106 facing second end 121b or cable interface 127 may be configured to be inserted through corresponding conductive holes in harness PCB 178 to form an electrical connection with harness PCB 178, as seen in FIG. 2.

Assembly of Sensor Assembly

In one illustrative example, a sensor housing assembly or assemblies 12 and two or more sensor unit sub-assemblies 20 may be provided. Where two or more sensor unit sub-assemblies 20 are offered, sensor units 20 may be substantially similar. For example, one or more pressure signal output terminals 30 of each of the two or more sensor unit sub-assemblies 20 may be provided at the same relative locations on respective sensor unit sub-assemblies 20 so that an electrical interface connection between the one or more pressure signal output terminal and the selected electrical terminal 122 of the electrical connector 120 of the sensor housing assembly 12 may be the same or substantially similar for each sensor unit sub-assembly 20. Similarly, pressure input ports 22 of the first and second sensor unit sub-assemblies 20 may be provided at same relative locations on sensor unit sub-assemblies 20 so that a pneumatic interface connection between pressure ports 22 of sensor unit sub-assemblies 20 and pressure port 110 of sensor housing assembly 12 may be the same or substantially similar. The circuitry on first circuit boards 60 and/or second circuit boards 70 of each sensor unit 20 of the two or more sensor units 20, however, may format one or more pressure signals provided by pressure sense element 52 in at least a first predetermined format in a first sensor unit 20 and at least a second predetermined format that may be different than the first format in a second sensor unit 20. Further, the formatting circuitry may be changed per sensor unit 20 by swapping out or changing either or both first PCB 60 and second PCB 70 or through other circuit changing techniques. In addition, or alternatively, each pressure sensor unit sub-assembly 20 may include a same or different sense element 52 or any combination of different and same sense elements 52. For example, a first sense element 52 of a first sub-assembly 20 may be more suited for a first pressure range and a second sense element 52 of a second sub-assembly 20 may be more suited for a second pressure range, where the first pressure range may includes ranges such as 1.0 PSI-9.0 PSI; 15 PSI-20 PSI, which may be ranges that are higher than the second pressure ranges of 0.1 PSI-0.9 PSI; 2.0 PSI-8 PSI. These are only examples. In some cases, the pressure ranges may be much higher such as 100-500 PSI, 1000-5000 PSI, etc. Also, and in an illustrative embodiment, the sense elements 52 may be selected from absolute pressure sense elements, gauge pressure sense elements, or other pressure sense elements. Example sense elements may include, but are not limited to, those described in U.S. Pat. Nos. 7,503,221; 7,493,822; 7,216,547; 7,082,835; 6,923,069; 6,877,380, and U.S. patent application publications: 2010/0180688; 2010/0064818; 2010/00184324; 2007/0095144; and 2003/0167851, all of which are hereby incorporated by reference.

As noted above, and in some instances, each of at least a first and second sensor unit 20 may provide differently formatted pressure output signals to one or more selected electrical terminal 122 of electrical connector 120. Further, and alternatively or in addition, sensor housing assembly 12 may include a third sensor unit sub-assembly 20 that is similar to first and second sensor unit sub-assemblies 20, however, the circuitry of the third sub-assembly 20 may format the one or more pressure output signal in a third output format that may be different from the first and second output formats and then transfer that pressure output signal in the third output format to selected electrical terminal(s) 122 of electrical connector 120. In these illustrative examples, the first output format may be a ratio-metric output format and the second output format may be a current format, or the first output format may be a ratio-metric output format and the second output format may be a digital format, or the first output format may be a current output format and the second output format may be a digital format or the output formats may be different combinations of formats or different formats.

Assembling a pressure sensor assembly 10 having sensor housing assembly 12 comprising pressure port 110, electrical connector 120 and outer housing 130 may include several selection steps. For example, the assembly may include selections for sensor housing assembly 12 of one of a plurality of pressure ports 110 (e.g., two or more pressure ports 110) where each of the plurality of pressure ports 110 at interior sides 114 have a fluid opening 118 that may be positioned at a common location across all of the plurality of pressure ports 110. External sides 112 of different pressure ports 110 in the plurality of pressure ports 110 may have different configurations including, but not limited to, threading or no threading on the exterior of external sides 112, threading or no threading on side walls 182 defining fluid path 116 at the external sides 112, and/or various shapes and sizes of pressure port 110 at external sides 112.

In one example, one of a plurality of electrical connectors 120 may be selected for housing assembly 12, where each of the plurality of electrical connectors 120 (e.g., two or more electrical connectors 120) may include second end 121b of body 121 having a different mechanical shape, size and/or configuration (e.g., dimension, perimeter size, perimeter outline, etc.) than at least one other second end 121b of the plurality of electrical connectors 120; first end 121a of body 121 having a common mechanical shape (e.g., dimension, perimeter size, perimeter outline, etc.) relative to the plurality of electrical connectors 120; sensor electrical terminals 86 for connecting to sensor unit 20 of third PCB 80 at common locations relative to conductive outer housing 130; and two or more electrical terminals 122 extending out of first end 121a and second end 121b of body 121 at common locations across all of the plurality of electrical connectors 120. For example, electrical terminals 122 in first end 121a of the plurality of electrical connectors 120 may be located at common locations relative to the common mechanical shape of first end 121a.

The assembly may further include selecting one of the plurality of pressure unit sub-assemblies 20, as discussed above. In some instances, once the parts or devices for pressure sensor assembly 10 have been selected or at least after selecting sub-assembly 20, sub-assembly 20 may be conditioned, calibrated, configured or tested or have other initial processing performed thereon prior to final assembly of sensor assembly 10.

Once the parts are selected and, if desired, calibration or testing has been performed on subassembly 20, pressure sensor assembly 10 may be assembled by connecting or assembling the selected pressure port 110, the selected electrical connector 120 and the selected pressure sensor unit subassembly 20, where the connected sensor unit subassembly 20 may provide a formatted one or more pressure output signal to the selected electrical terminals 122 of connected electrical connector 120. After or before connection of the selected parts, the parts may be slid into or positioned within aperture 136 of outer housing 130 to form pressure sensor assembly 10. Further, once the parts are within outer housing 130, conductive outer housing 130 may be secured relative to the selected electrical connector 120 and pressure port 110. Securing outer housing 130 relative to electrical connector 120 may include forming (e.g., crimping, bending, etc.) outer housing 130 around shoulder 126 of electrical connector 120, fastening outer housing 130 to electrical connector 120 and/or securing by another securing technique. Securing outer housing 130 relative to pressure port 110 may include forming or welding outer housing 130 around or to pressure port 110 and/or using any other suitable connection technique to secure housing 130 to pressure port 110.

In some cases, no adjustment or calibration of the sensor unit subassembly 20 is required after final assembly of the pressure sensor 10, e.g. after the selected pressure port 110, the selected electrical connector 120, the outer housing and the selected pressure sensor unit subassembly 20 are assembled together into a functioning unit. Also, and in some cases, the assembled pressure sensor assembly 10 may have no mechanism (e.g. device, pin and other mechanism) for adjusting and/or calibrating the sensor unit subassembly 20 after final assembly of pressure sensor assembly 10.

Having thus described several illustrative embodiments of the present disclosure, those of skill in the art will readily appreciate that yet other embodiments may be made and used within the scope of the claims hereto attached. It will be understood that this disclosure is, in many respects, only illustrative. Changes may be made in details, particularly in matters of shape, size, and arrangement of parts without exceeding the scope of the disclosure. The disclosure's scope is, of course, defined in the language in which the appended claims are expressed.

What is claimed is:

1. A cover for a sensor sub-assembly, wherein the sensor sub-assembly includes a first printed circuit board that carries a sensor, the cover comprising:
   an electrically insulating body;
   the electrically insulating body including a first support feature that extends across at least a majority of the first printed circuit board, a second support feature that extends across at least a majority of the first printed circuit board, and a perimeter support feature that is positioned adjacent to a perimeter of the first printed circuit board, wherein at least part of the second support feature is spaced from the first support feature by a gap, wherein the sensor is situated in the gap, and wherein at least part of the first support feature is inwardly spaced from the perimeter support feature and has a side wall that faces outward toward the perimeter support feature;
   the electrically insulating body further including one or more vents that allow air to flow to the sensor, wherein one or more of the vents extend through one or more of the first support feature, the second support feature, and the perimeter support feature; and
   one or more electrical terminals supported by the electrically insulating body that convey one or more electrical signals to and/or from the first printed circuit board.

2. The cover of claim 1, wherein the first support feature contacts the first printed circuit board at two or more places, and the second support feature contacts the first printed circuit board at two or more places.

3. The cover of claim 1, wherein the perimeter support feature extends around at least a majority of a perimeter of the first printed circuit board.

4. The cover of claim 1, wherein the one or more electrical terminals include one or more compliant pins that are configured to extend into corresponding holes in the first printed circuit board.

5. The cover of claim 4, wherein the electrically insulating body is further configured to engage a second printed circuit board situated vertically above the first printed circuit board, wherein the one or more electrical terminals include one or more compliant pins that are configured to extend into corresponding holes in the second printed circuit board.

6. The cover of claim 5, wherein the one or more compliant pins are the only mechanism that mechanically secures the first printed circuit board to the second printed circuit board.

7. The cover of claim 1, further comprising:
   an alignment feature for aligning the cover with the first printed circuit board.

8. The cover of claim 1, further comprising:
   an alignment feature for aligning the cover with a parent sensor assembly.

* * * * *